(12) United States Patent
Hong et al.

(10) Patent No.: US 10,910,346 B2
(45) Date of Patent: Feb. 2, 2021

(54) SEMICONDUCTOR PACKAGE

(71) Applicant: Samsung Electronics Co., Ltd., Suwon-si (KR)

(72) Inventors: Ji-seok Hong, Yongin-si (KR); Ji-hoon Kim, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/445,861

(22) Filed: Jun. 19, 2019

(65) Prior Publication Data

US 2020/0111763 A1 Apr. 9, 2020

(30) Foreign Application Priority Data

Oct. 4, 2018 (KR) .................. 10-2018-0118491

(51) Int. Cl.
*H01L 25/065* (2006.01)
*H01L 23/31* (2006.01)
*H01L 23/00* (2006.01)
*H01L 21/56* (2006.01)
*H01L 25/00* (2006.01)

(52) U.S. Cl.
CPC ...... *H01L 25/0657* (2013.01); *H01L 23/3185* (2013.01); *H01L 23/3192* (2013.01); *H01L 24/08* (2013.01); *H01L 21/561* (2013.01); *H01L 21/568* (2013.01); *H01L 24/94* (2013.01); *H01L 25/50* (2013.01); *H01L 2224/08146* (2013.01); *H01L 2225/06541* (2013.01)

(58) Field of Classification Search
CPC . H01L 51/56; H01L 51/0072; H01L 51/0097; H01L 51/5016; H01L 51/5056

USPC .......................................................... 257/777
See application file for complete search history.

(56) References Cited

U.S. PATENT DOCUMENTS

| 5,657,207 | A | 8/1997 | Schreiber et al. |
| 6,858,941 | B2 | 2/2005 | Ference et al. |
| 7,531,906 | B2 | 5/2009 | Lee |
| 7,969,016 | B2 | 6/2011 | Chen et al. |
| 8,552,380 | B1 | 10/2013 | Florin et al. |
| 8,575,760 | B2 * | 11/2013 | Phee .................. H01L 21/76898 257/621 |

(Continued)

OTHER PUBLICATIONS

Extended European Search Report dated Mar. 12, 2020 issued in corresponding European Application No. 19171799.0.

*Primary Examiner* — Andy Huynh
(74) *Attorney, Agent, or Firm* — Harness, Dickey & Pierce, P.L.C.

(57) ABSTRACT

A semiconductor package includes: a lower semiconductor chip including a first semiconductor substrate, which includes a first semiconductor device on an active surface thereof and a protrusion defined by a recess region on an inactive surface thereof opposite to the active surface, a plurality of external connecting pads on a bottom surface of the first semiconductor substrate, and a plurality of through-electrodes electrically connected to the plurality of external connecting pads; and at least one upper semiconductor chip stacked on the protrusion of the lower semiconductor chip and electrically connected to the plurality of through-electrodes, the at least one upper semiconductor chip including a second semiconductor substrate which includes a second semiconductor device on an active surface thereof.

20 Claims, 43 Drawing Sheets

(56) References Cited

U.S. PATENT DOCUMENTS

| | | |
|---|---|---|
| 9,606,308 B2 | 3/2017 | Barwicz et al. |
| 9,837,394 B2 | 12/2017 | Clevenger et al. |
| 2010/0248424 A1 | 9/2010 | Luce et al. |
| 2010/0320587 A1 | 12/2010 | Lee et al. |
| 2012/0133041 A1 | 5/2012 | Phee et al. |
| 2013/0049195 A1 | 2/2013 | Wu et al. |
| 2015/0214110 A1 | 7/2015 | Lin et al. |

* cited by examiner

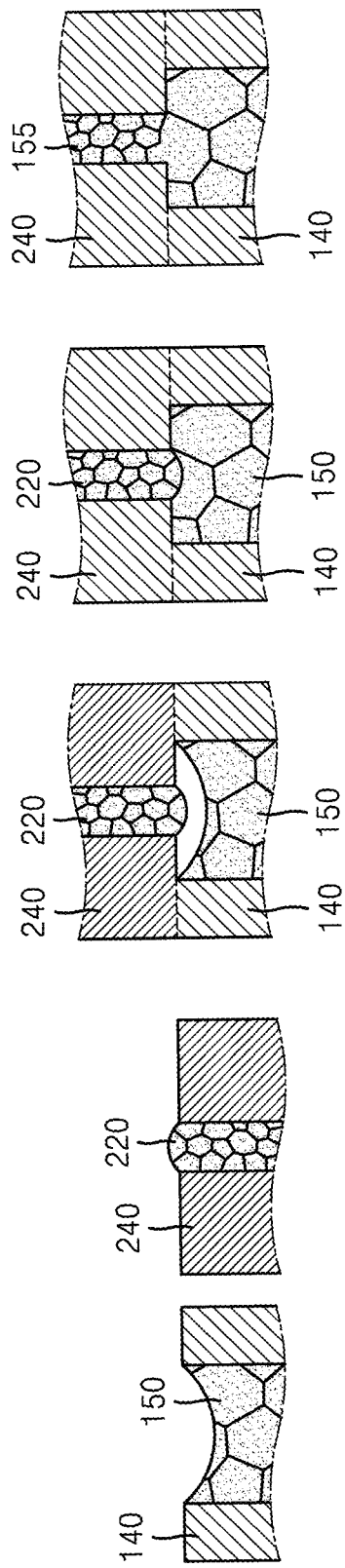

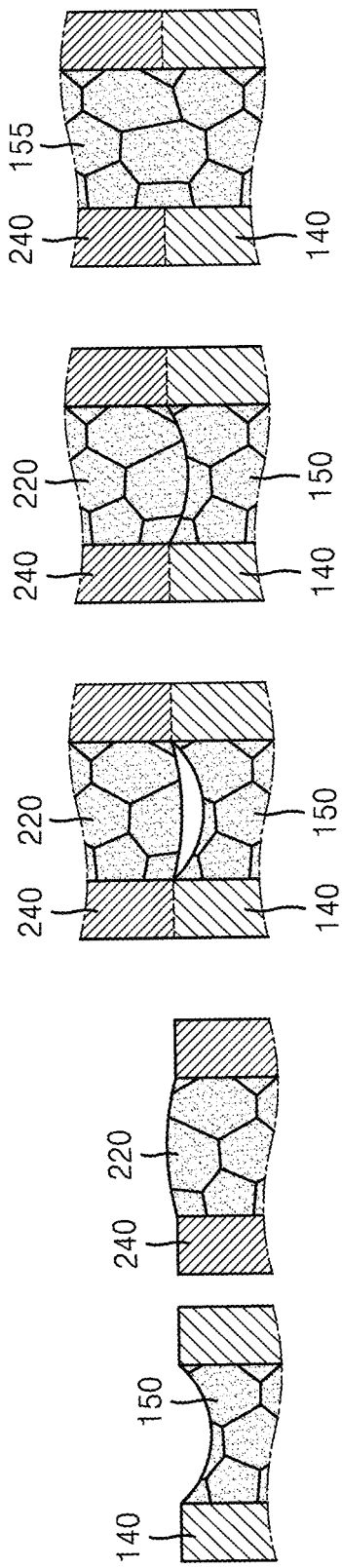

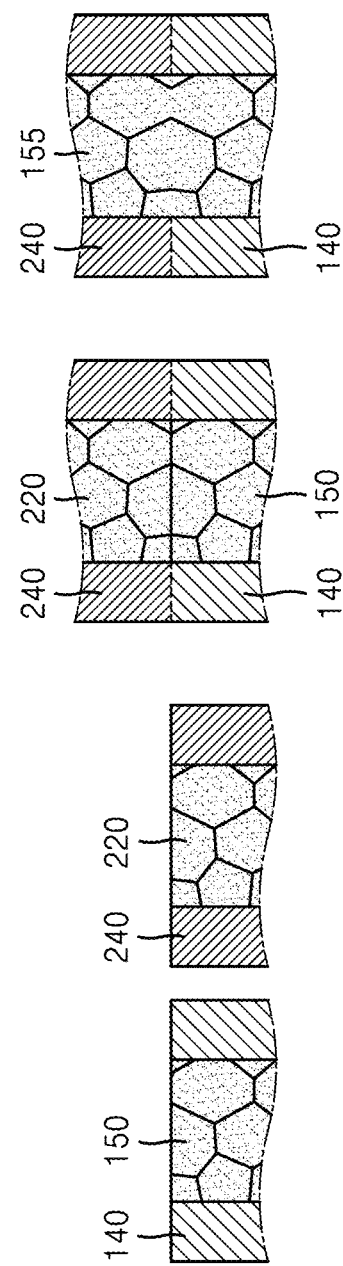

SEMICONDUCTOR PACKAGE

CROSS-REFERENCE TO RELATED APPLICATION

This application claims the benefit of Korean Patent Application No. 10-2018-0118491, filed on Oct. 4, 2018, in the Korean Intellectual Property Office, the disclosure of which is incorporated herein in its entirety by reference.

BACKGROUND

The inventive concepts relate to a semiconductor package, and more particularly, to a semiconductor package including a plurality of semiconductor chips.

Electronic devices have become more compact, versatile, and/or of larger-capacity according to the rapid development of the electronic industry and the demands of users, and accordingly, semiconductor packages including a plurality of semiconductor chips of two or more kinds are required.

In addition, as the number of connecting members of the plurality of semiconductor chips included in the semiconductor packages increases, fine pitches and/or connection reliability of the connecting members are desirable.

SUMMARY

The inventive concepts provide a semiconductor package including connecting members having fine pitches, and a plurality of semiconductor chips securing connection reliability between the connecting members.

According to an aspect of the inventive concepts, there is provided a semiconductor package including: a lower semiconductor chip including a first semiconductor substrate, which includes a first semiconductor device on an active surface thereof and a protrusion defined by a recess region on an inactive surface thereof opposite to the active surface, a plurality of external connecting pads on a bottom surface of the first semiconductor substrate, and a plurality of through-electrodes electrically connected to the plurality of external connecting pads; and at least one upper semiconductor chip stacked on the protrusion of the lower semiconductor chip and electrically connected to the plurality of through-electrodes, the at least one upper semiconductor chip including a second semiconductor substrate which includes a second semiconductor device on an active surface thereof, wherein the at least one upper semiconductor chip has a horizontal area less than a horizontal area of the lower semiconductor chip to be all superimposed on at least a portion of the protrusion in a vertical direction.

According to another aspect of the inventive concepts, there is provided a semiconductor package including: a lower semiconductor chip including a first semiconductor substrate, which includes a first semiconductor device on an active surface thereof and a protrusion defined by a first recess region on an inactive surface thereof opposite to the active surface, a first cover insulating layer configured to cover a top surface of the protrusion, a plurality of external connecting pads on a bottom surface of the first semiconductor substrate, and a plurality of first through-electrodes electrically connected to the plurality of external connecting pads; at least one upper semiconductor chip including a second semiconductor substrate, stacked on the protrusion of the lower semiconductor chip and including a second semiconductor device on an active surface thereof, and a second cover insulating layer configured to cover the active surface of the second semiconductor substrate; and a plurality of bonded pads across the first cover insulating layer and the second cover insulating layer, the plurality of bonded pads electrically connecting the upper semiconductor chip to the plurality of first through-electrodes.

According to another aspect of the inventive concepts, there is provided a lower semiconductor chip including a first semiconductor substrate which includes a first semiconductor device on an active surface thereof and a plurality of first through-electrodes configured to penetrate the first semiconductor substrate, the lower semiconductor chip including protrusions on an inactive surface opposite to the active surface of the first semiconductor substrate; and a first upper semiconductor chip including each of side surfaces thereof aligned with side surfaces of the protrusions of the lower semiconductor chip in a vertical direction, the first upper semiconductor chip including a second semiconductor substrate including a second semiconductor device thereon and a plurality of second through-electrodes configured to penetrate the second semiconductor substrate, and a third semiconductor substrate stacked on the first upper semiconductor chip and electrically connected to the plurality of second through-electrodes, the third semiconductor substrate including a third semiconductor device thereon, wherein the second semiconductor device and the third semiconductor device are of an identical type and are different from the first semiconductor device.

BRIEF DESCRIPTION OF THE DRAWINGS

Embodiments of the inventive concepts will be more clearly understood from the following detailed description taken in conjunction with the accompanying drawings in which:

FIGS. 19A-D through 21A-C are cross-sectional views for conceptually illustrating a process of forming a bonded pad, a first bonded pad, and a second bonded pad in a method of manufacturing a semiconductor package, according to embodiments.

DETAILED DESCRIPTION OF EMBODIMENTS

Figure 1A:
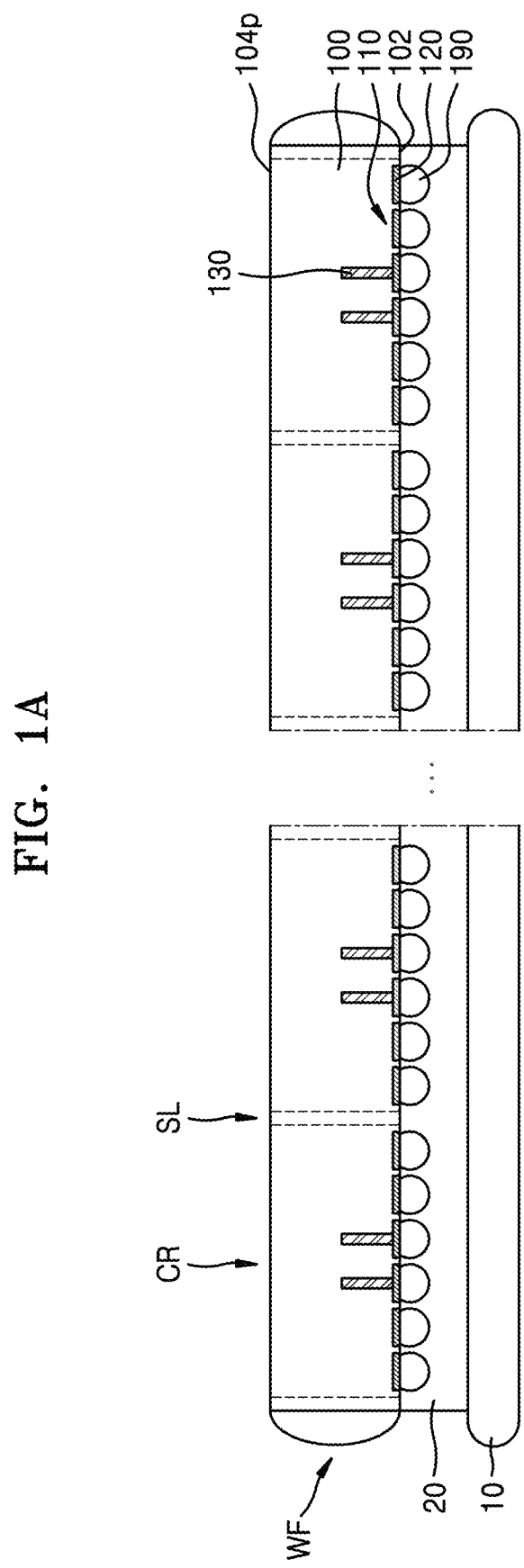
FIGS. 1A through 1K are cross-sectional views illustrating a method of manufacturing a semiconductor package according to embodiments.
Figure 1B:
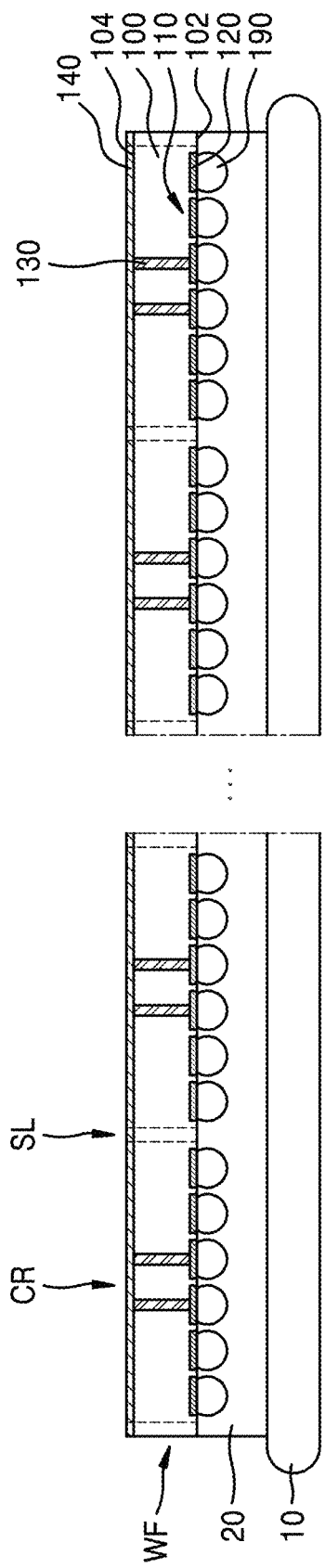
Figure 1C:
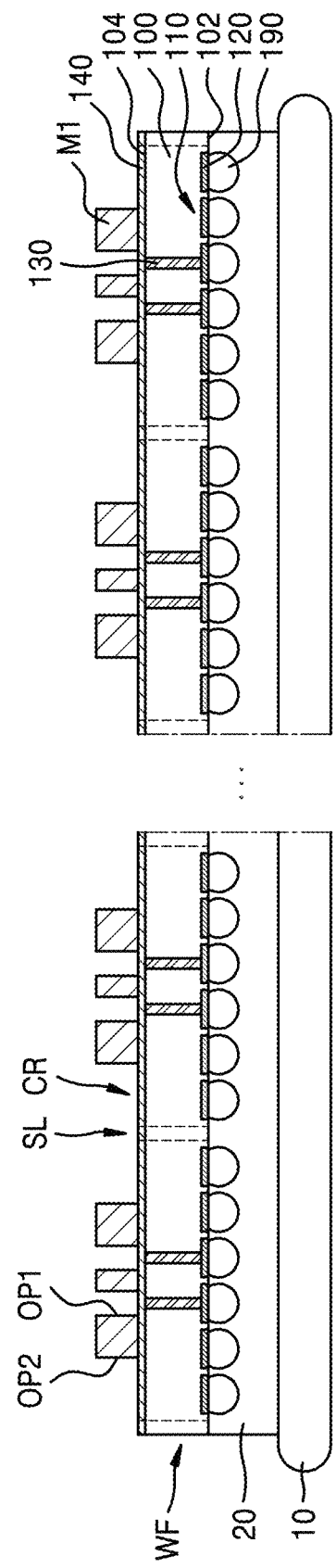
Figure 1D:
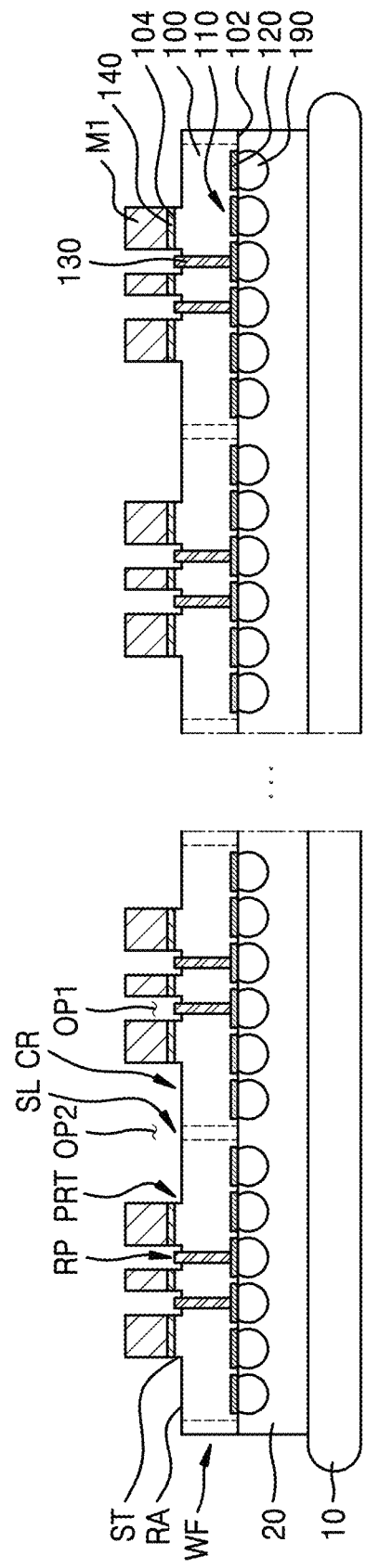
Figure 1E:
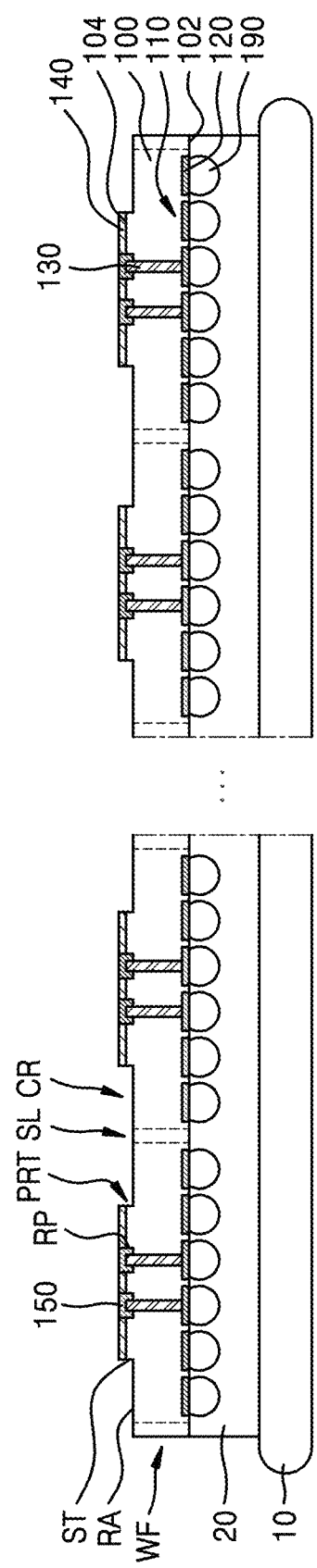
Figure 1F:
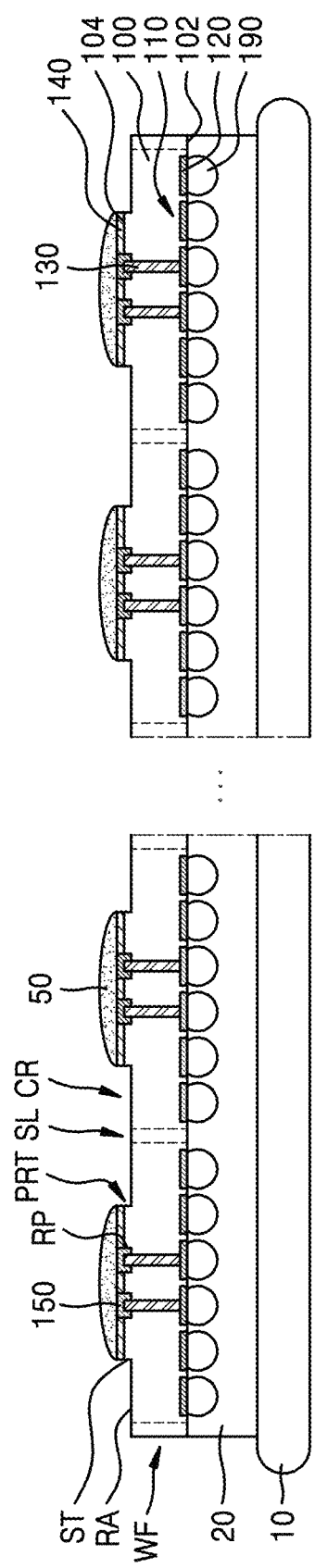
Figure 1G:
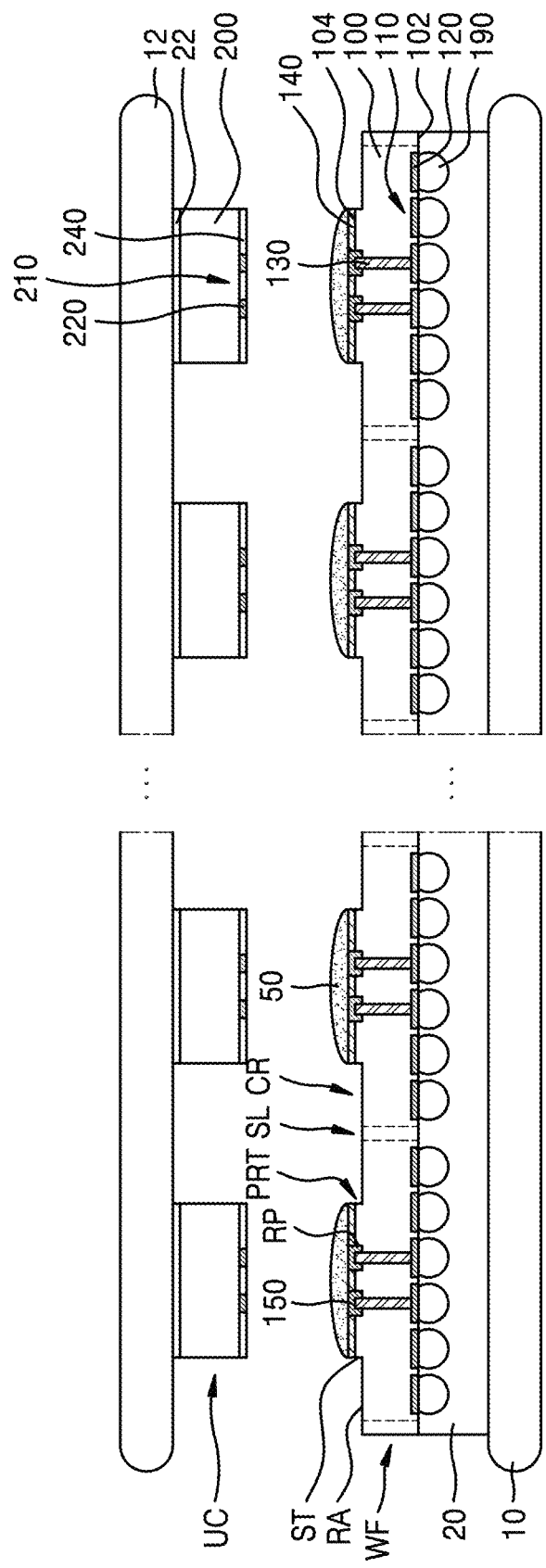
Figure 1H:
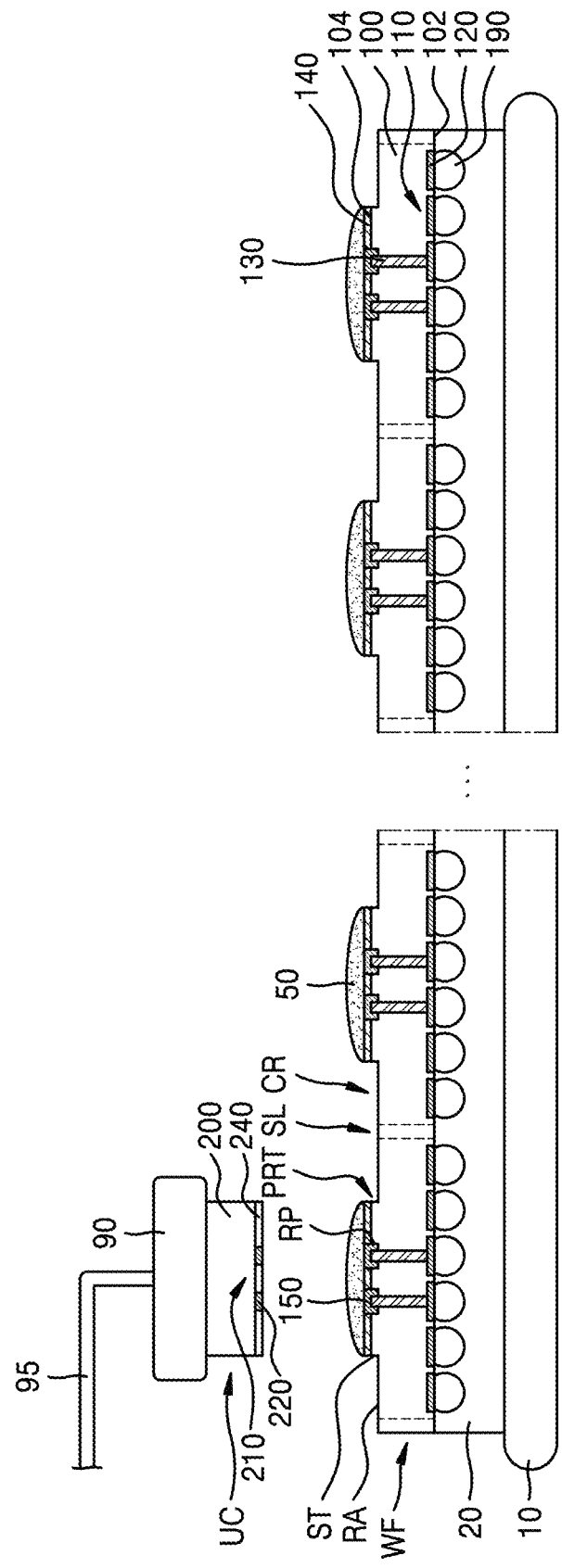
Figure 1I:
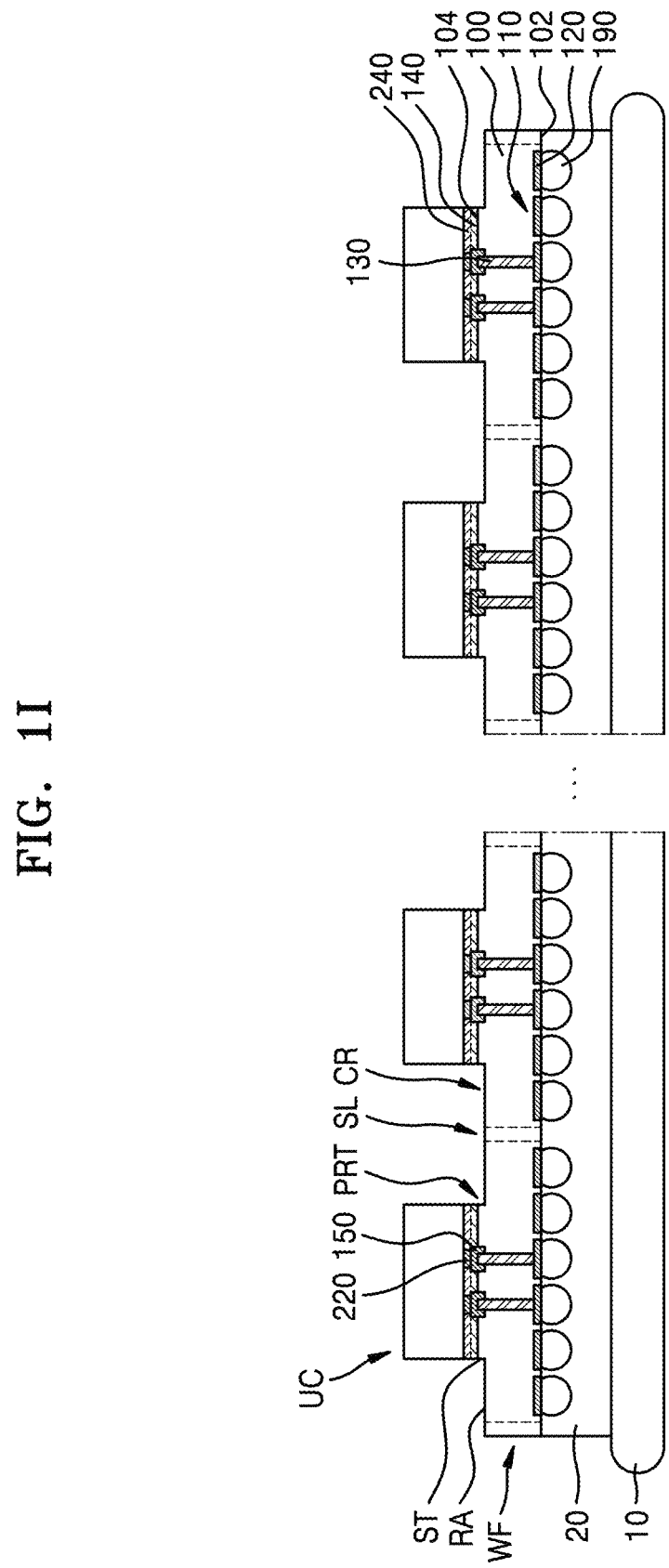
Figure 1J:
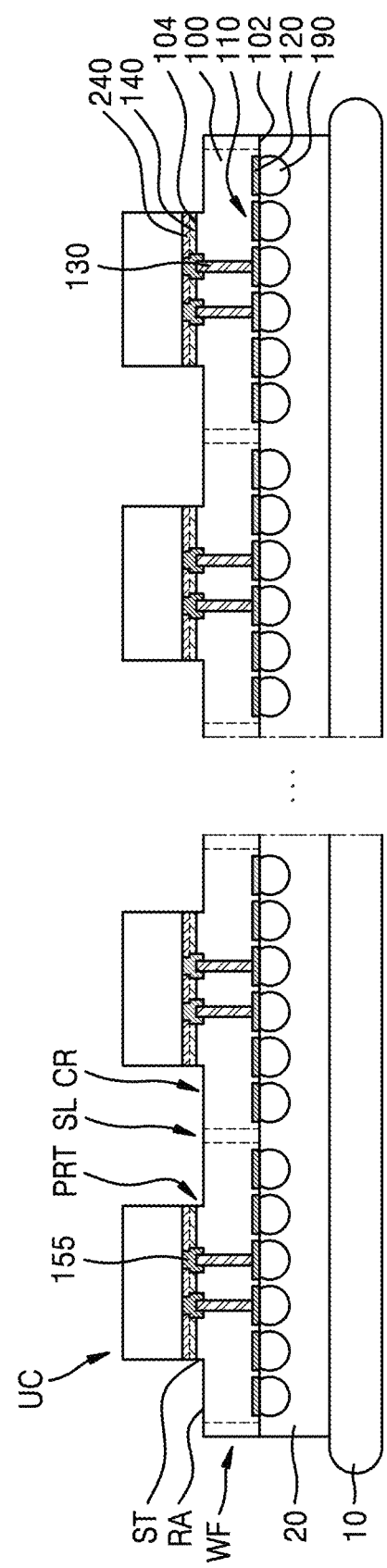
Figure 1K:
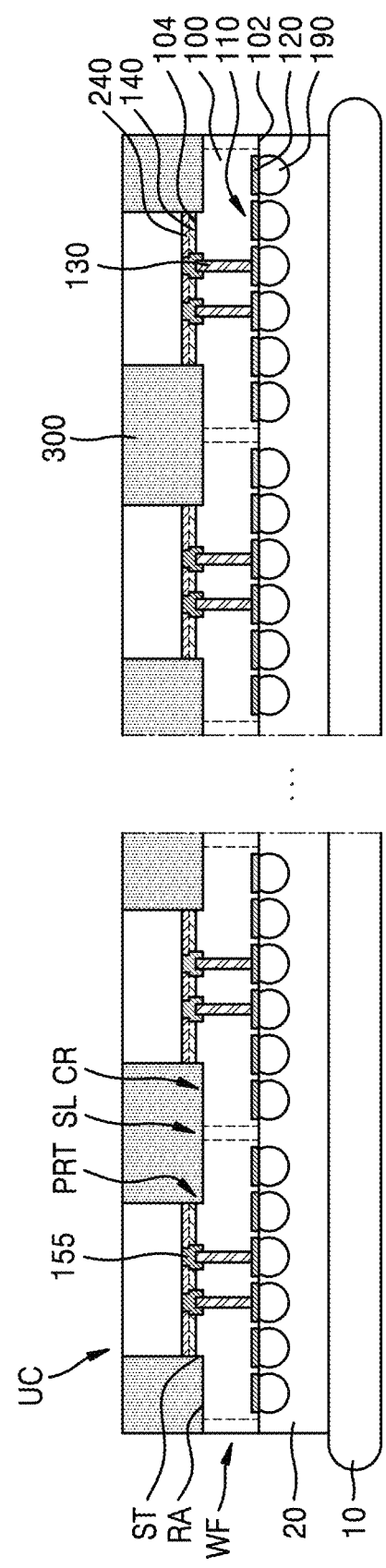
Figure 2:
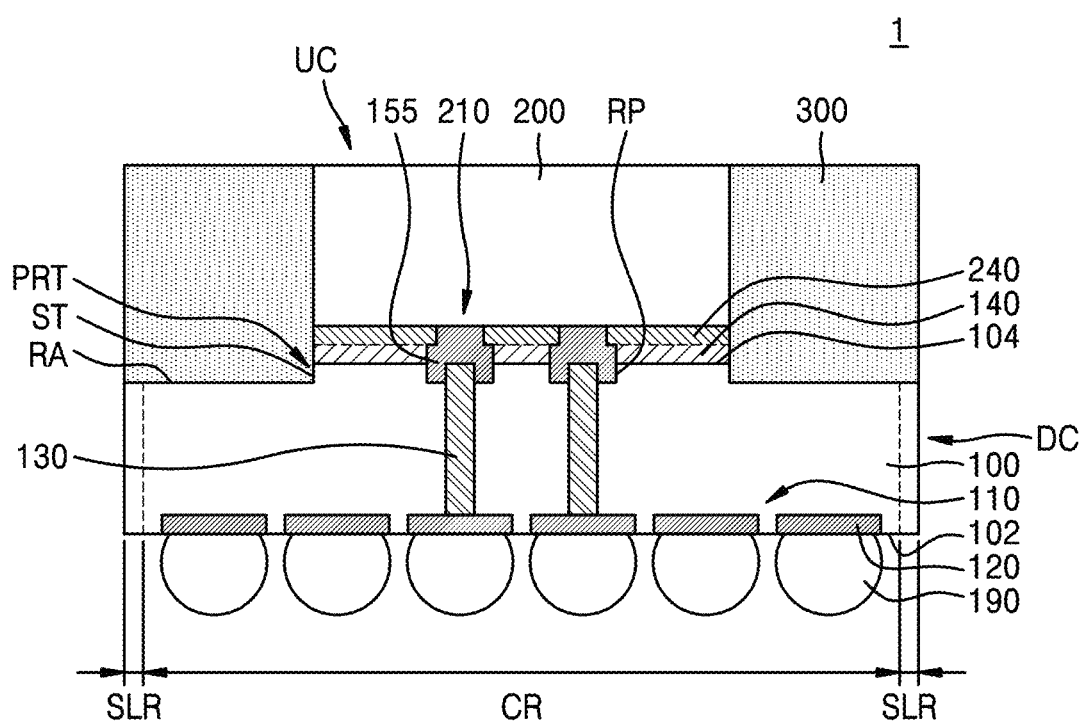
FIG. 2 is a cross-sectional view illustrating a semiconductor package according to embodiments.

FIGS. 1A through 1K are cross-sectional views illustrating a method of manufacturing a semiconductor package according to embodiments, and FIG. 2 is a cross-sectional view illustrating a semiconductor package 1 according to embodiments.

Referring to FIG. 1A, a wafer structure WF may be attached to a first carrier substrate 10 with a first adhesive film 20 therebetween. The first carrier substrate 10 may include a semiconductor substrate, a glass substrate, a ceramic substrate, a plastic substrate, etc. The first adhesive film 20 may include a non-conductive film (NCF), an anisotropic conductive film (ACF), an instant adhesive, a thermosetting adhesive, a laser curing adhesive, an ultrasonic curing adhesive, a non-conductive paste (NCP), etc.

The wafer structure WF may include a first semiconductor substrate 100 having a plurality of semiconductor chip regions CR separated by a scribe lane region SL. The plurality of semiconductor chip regions CR may denote portions that are to be separated from the wafer structure WF into individual semiconductor chips through a sawing process performed along the scribe line region SL.

In each of the plurality of semiconductor chip regions CR of the wafer structure WF, a first semiconductor device 110, a plurality of first front connecting pads 120, and/or a plurality of first through-electrodes 130 may be arranged.

The first semiconductor substrate 100 may include, for example, silicon (Si). Alternatively, the first semiconductor substrate 100 may include a semiconductor element such as germanium (Ge), or a compound semiconductor such as silicon carbide (SiC), gallium arsenide (GaAs), and indium arsenide (InAs). Alternatively, the first semiconductor substrate 100 may have a silicon on insulator (SOI) structure. For example, the first semiconductor substrate 100 may include a buried oxide (BOX) layer. The first semiconductor substrate 100 may include a conductive region, for example, a well doped with an impurity, or a structure doped with an impurity. In addition, the first semiconductor substrate 100 may have various device isolation structures such as a shallow trench isolation (STI) structure. The first semiconductor substrate 100 may include a first surface 102 which is an active surface and a second surface 104p which is an inactive surface opposite to the first surface 102. For example, on the first surface 102 of the first semiconductor substrate 100, the first semiconductor device 110 and the plurality of first front connecting pads 120 may be arranged.

In this specification, unless otherwise specified, components having the terms front and back may refer to components on an active surface side and components on an inactive surface side, respectively. In addition, unless otherwise specified, the terms top surface and bottom (lower) surface may refer to a surface on a top side and a surface on a bottom side in the drawings, respectively.

The first semiconductor device 110 may include, for example, a central processing unit (CPU), a graphics processing unit (GPU), or an application processor (AP).

The plurality of first front connecting pads 120 may be electrically connected to the first semiconductor device 110 and/or the plurality of first through-electrodes 130. The plurality of first front connecting pads 120 may include a material including, for example, copper (Cu). A plurality of external connecting terminals 190 electrically connected to the first semiconductor device 110 and/or the plurality of first through-electrodes 130 may be attached to the plurality of first front connecting pads 120. The first adhesive film 20 may fill a space between the wafer structure WF and the first carrier substrate 10 and cover the external connecting terminal 190.

The first through-electrode 130 may include an end extending from the other end thereof facing the first front connecting pad 120 to the inside of the first semiconductor substrate 100 toward the second surface 104p. At least a portion of the first through-electrode 130 may be columnar. The first through-electrode 130 may include a barrier layer formed on a columnar surface thereof and a buried conductive layer filling the inside of the barrier layer.

An insulating layer may be between the first semiconductor substrate 100 and the first through-electrode 130. The insulating layer may reduce or prevent direct contact between the first semiconductor substrate 100 and the first through-electrode 130.

A wiring structure for electrical connection may be provided between the first semiconductor device 110 and the plurality of first front connecting pads 120 and/or between the plurality of first through-electrodes 130 and the plurality of first front connecting pads 120. The wiring structure may include at least one metal wiring layer and at least one via plug connected to the at least one metal wiring layer. The plurality of wiring structures may include the metal wiring layer and the via plug. The metal wiring layer and the via plug may include a wiring barrier layer and a wiring metal layer. The wiring barrier layer may include at least one of Ti, TiN, Ta, and TaN. The wiring metal layer may include at least one of W, Al, and Cu. The metal wiring layer and the via plug may include the same material. Alternatively, at least portions of the metal wiring layer and the via plug may include different materials. The plurality of metal wiring layers and/or the plurality of via plugs may have multi-layer structures. In other words, the wiring structure may be a multi-layer structure in which two or more of the metal wiring layers or two or more of the via plugs are alternately stacked.

Referring to FIG. 1B, a portion of the first semiconductor substrate 100 of the wafer structure WF may be removed from the second surface (104p in FIG. 1A) to expose the first through-electrode 130, and accordingly, a second surface 104, which is new, opposite to the first surface 102 may be formed. In some embodiments, after a portion of an edge of the first semiconductor substrate 100 in the wafer structure WF is removed, a portion of the first semiconductor substrate 100 may be removed to expose the first through-electrode 130.

Next, a first cover insulating layer 140 covering the first through-electrode 130 may be formed on the second surface 104 of the first semiconductor substrate 100. The first cover insulating layer 140 may include SiO, SiN, SiCN, SiCO, or a polymer material. For example, the polymer material may include BCB, PI, PBO, silicone, acrylate, or epoxy.

Referring to FIG. 1C, a mask pattern M1 including a plurality of first openings OP1 and a plurality of second openings OP2 exposing a portion of the first cover insulating layer 140 may be formed on the first cover insulating layer 140. The plurality of first openings OP1 corresponding to the plurality of first through-electrodes 130 may have a horizontal width greater than that of the first through-electrodes 130, and the second opening OP2 may expose an edge portion of the semiconductor chip region CR and the scribe lane region SL. The second opening OP2 may surround peripheries of the mask pattern M1 and peripheries of the plurality of first openings OP1.

Referring to FIG. 1D, portions of the first cover insulating layer 140 and the first semiconductor substrate 100 may be removed by using the mask pattern M1 as an etch mask to expose the first semiconductor substrate 100 on lower surfaces of the removed portions, respectively, and then, a plurality of first recess regions RP corresponding to the plurality of first openings OP1 and a second recess region RA corresponding to the second openings OP2 may be formed. In some embodiments, the first semiconductor substrate 100 and the plurality of first through-electrodes 130 may be exposed together on the lower surfaces of the plurality of first recess regions RP. A horizontal width of the plurality of first recess portions RP may be greater than that of the plurality of first through-electrodes 130, and the second recess region RA may extend from the scribe lane region SL toward the inside of the semiconductor chip region CR in the horizontal direction. A protruding portion of the first semiconductor substrate 100 defined by the second recess region RA may be referred to as a protrusion PRT, and a side surface of the protrusion PRT facing the second recess region RA may be referred to as a stepped portion ST. A portion of the first cover insulating layer 140 that remains after the process of forming the first recess region RP and the second recess region RA may cover the top surface of the protrusion PRT.

The lower surfaces of the plurality of first recess regions RP and lower surfaces of the second recess region RA may be at a lower level than the second surface 104 of the first semiconductor substrate 100. The lower surface of each of the plurality of first recess regions RP and the lower surface of each of the second recess region RA may be at the same level as each other.

A horizontal width and a horizontal area of the protrusion PRT defined by the second recess region RA may have the same values as a horizontal width and a horizontal area of an upper semiconductor chip UC illustrated in FIGS. 1G and 1H.

Referring to FIG. 1E, a plurality of first back connecting pads 150, which fill the plurality of first recess regions RP and are electrically connected to the plurality of first through-electrodes 130, may be formed. The plurality of first back connecting pads 150 may include a material including, for example, Cu.

A top surface of the plurality of first back connecting pads 150 may be coplanar with a top surface of the first cover insulation layer 140. In some embodiments, the top surface of the first back connecting pad 150 may convexly protrude relative to the top surface of the first cover insulating layer 140. In other embodiments, the top surface of the first back connecting pad 150 may be concavely recessed relative to the top surface of the first cover insulating layer 140.

Referring to FIG. 1F, distilled water (DI water) 50 may be applied on the first cover insulating layer 140. In some embodiments, the DI water 50 may be applied only on a top surface of the projection PRT. The DI water 50 may be doped only on the first cover insulating layer 140 except for the second recess region RA, but embodiments are not limited thereto. Hydroxide ions (OH—) may be formed on the first cover insulating layer 140 doped with the DI water 50.

Referring to FIG. 1G, the plurality of upper semiconductor chips UC may be attached to a second carrier substrate 12 with a second adhesive layer 22 therebetween. The horizontal width of each of the plurality of upper semiconductor chips UC may have a value less than a horizontal width of each of the plurality of semiconductor chip regions CR. The plurality of upper semiconductor chips UC may be attached to the second carrier substrate 12 with the same or similar numbers as the plurality of semiconductor chip regions CR to correspond to the plurality of semiconductor chip regions CR. Each of the plurality of upper semiconductor chips UC may correspond to the protrusion PRT.

The upper semiconductor chip UC may include a second semiconductor substrate 200, a second semiconductor device 210, and/or a plurality of second front connecting pads 220. The second semiconductor substrate 200 may include a semiconductor device or a compound semiconductor. The second semiconductor substrate 200 may include an active surface and an inactive surface opposite to the active surface. For example, the second semiconductor device 210 and the plurality of second front connecting pads 220 may be on the active surface of the second semiconductor substrate 200. A second cover insulating layer 240 covering the second front connecting pad 220 may be on the active surface of the second semiconductor substrate 200.

The second semiconductor device 210 may include, for example, a memory device. For example, the second semiconductor device 210 may include a volatile memory device such as dynamic random-access memory (RAM) (DRAM) and static RAM (SRAM), and a nonvolatile memory device such as phase-change RAM (PRAM), magnetoresistive RAM (MRAM), ferroelectric RAM (FeRAM), and resistive RAM (RRAM). In some embodiments, the second semiconductor device 210 may include higher bandwidth memory (HBM) DRAM.

The plurality of second front connecting pads 220 may include a material including, for example, Cu.

The second cover insulating layer 240 may include SiO, SiN, SiCN, SiCO, or a polymer material. For example, the polymer material may include BCB, PI, PBO, silicone, acrylate, or epoxy.

Top surfaces of the plurality of second front connecting pads 220 and the plurality of the second cover insulation layers 240 may be coplanar with each other. In some embodiments, the top surface of the second front connecting pad 220 may convexly protrude relative to the top surface of the second cover insulating layer 240. In other embodiments, the top surface of the second front connecting pad 220 may be concavely recessed relative to the top surface of the first cover insulating layer 140.

In some embodiments, a horizontal width of each of the plurality of first back connecting pads 150 and a horizontal width of each of the plurality of second front connecting pads 220 may have the same value. However, in some other embodiments, the horizontal width of each of the plurality of first back connecting pads 150 and the horizontal width of each of the plurality of second front connecting pads 220 may have different values.

Thereafter, by reducing a distance between the first carrier substrate 10 and the second carrier substrate 12, the plurality of the upper semiconductor chips UC may be brought into contact with the wafer structure WF such that the plurality of upper semiconductor chips UC correspond to the protrusions PRT of the plurality of semiconductor chip regions CR.

In some embodiments, by repeating a process of bringing one or more than two upper semiconductor chips UC into contact with the wafer structure WF, such that one or more than two upper semiconductor chips UC correspond to the protrusions PRT of one or more semiconductor chip regions CR among the plurality of semiconductor chip regions CR by attaching a pickup unit 90 connected to a driver 95 in a unit of one or more than two upper semiconductor chips UC as illustrated in FIG. 1H, the plurality of upper semiconductor chips UC may be brought into contact with the wafer structure WF.

The stepped portion ST may be used as an alignment key in the process of attaching the plurality of upper semiconductor chips UC to the protrusions PRT. Side surfaces of the stepped portion ST and side surfaces of the plurality of upper semiconductor chips UC may be aligned with each other in the vertical direction.

Referring to FIG. 1I, the first cover insulating layer 140 and the second cover insulating layer 240 of the upper semiconductor chip UC on the protruding portion PRT may be attached to each other by the OH— that has been explained with reference to FIG. 1F. For example, the first cover insulating layer 140 and the second cover insulating layer 240, which are correspondingly in contact with each other, may be bonded together with a covalent bond.

In some embodiments, in the process of attaching the plurality of upper semiconductor chips UC to the wafer structure WF to correspond the plurality of upper semiconductor chips UC to the protrusions PRT of the plurality of semiconductor chip region CR, the first cover insulating layer 140 and the second cover insulating layer 240 may be bonded to each other by applying heat and/or pressure. For example, heat of a first temperature may be applied in the process of attaching the plurality of upper semiconductor chips UC to the wafer structure WF to correspond to the projections PRT of the plurality of semiconductor chip regions CR.

Referring to FIGS. 1I and 1J, a plurality of bonded pads 155 may be formed by using direct hybrid bonding technology. By applying heat of a second temperature higher than the first temperature, The plurality of bonded pads 155 may be formed in which the plurality of first back connecting pads 150 and the plurality of second front connecting pads 220, which correspond to each other, are bonded to each other. The plurality of first back connecting pads 150 and the plurality of second front connecting pads 220, which correspond to each other, may be expanded by heat to be in contact with each other, and then may be formed as the plurality of bonded pads 155, which have been diffusion bonded to form an integral body through diffusion of metal atoms included in the plurality of first back connecting pads 150 and the plurality of second front connecting pads 220.

Referring to FIG. 1K, a molding member 300 surrounding the upper semiconductor chip UC on the wafer structure WF may be formed. The molding member 300 may include, for example, an epoxy molding compound (EMC). The molding member 300 may cover a top surface of the wafer structure WF, the side surface of the projection PRT, and the side surface of the upper semiconductor chip UC. In some embodiments, the molding member 300 may expose a top surface of the upper semiconductor chip UC without covering it.

Referring to FIGS. 1K and 2 together, by cutting the molding member 300 and the wafer structure WF along the scribe lane region SL, a plurality of semiconductor packages 1, which are separated from each other, may be formed. The semiconductor package 1 may include a lower semiconductor chip DC and the upper semiconductor chip UC which is stacked on the lower semiconductor chip DC and has the horizontal width and the horizontal area less than a horizontal width and a horizontal area of the lower semiconductor chip DC. The lower semiconductor chip DC may be a portion of the wafer structure WF, which has been cut and separated along the scribe lane region SL.

The lower semiconductor chip DC may include the first semiconductor substrate 100, the first semiconductor device 110, the plurality of first front connecting pads 120, the plurality of first through-electrodes 130, and/or the first cover insulating layer 140.

The first semiconductor substrate 100 may include the first surface 102 which is an active surface and the second surface 104 which is an inactive surface opposite to the first surface 102. On the first surface 102 of the first semiconductor substrate 100, the first semiconductor device 110 and the plurality of first front connecting pads 120 may be arranged.

The first semiconductor substrate 100 may include the semiconductor chip region CR and a remaining scribe lane region SLR surrounding the semiconductor chip region CR. The remaining scribe lane region SLR may denote a portion that remains in the scribe lane region SL that has been cut, in the process of forming the semiconductor package 1 by cutting the molding member 300 and the wafer structure WF as described with reference to FIG. 1J.

The first semiconductor device 110 may include, for example, a CPU device, a GPU device, or an AP device.

The plurality of first front connecting pads 120 may be electrically connected to the first semiconductor device 110 and/or the plurality of first through-electrodes 130. A plurality of external connecting terminals 190 electrically connected to the first semiconductor device 110 and/or the plurality of first through-electrodes 130 may be attached to the plurality of first front connecting pads 120. The external connecting terminal 190 may include a conductive material such as Cu, aluminum (Al), silver (Ag), tin (Sn), gold (Au), solder, etc. However, the material of the external connecting terminal 190 is not limited thereto. The external connecting terminal 190 may be formed as a multi-layer or a single layer. For example, in the case of being formed as a multi-layer, the external connecting terminal 190 may include a copper pillar and the solder, and in the case of the single layer, the external connecting terminal 190 may include Sn, solder, or Cu. The first front connecting pad 120 may also be referred to as an external connecting pad.

The plurality of first through-electrodes 130 may extend through at least a portion of the first semiconductor substrate 100 from the first front connecting pad 120 to the second surface 104 of the first semiconductor substrate 100. In some embodiments, the plurality of first through-electrodes 130 may partially protrude from the second surface 104 to the outside of the first semiconductor substrate 100.

In some embodiments, a wiring structure for electrical connection may be provided between the first semiconductor device 110 and the plurality of first front connecting pads 120 and/or between the plurality of first through-electrodes 130 and the plurality of first front connecting pads 120. The wiring structure may include at least one metal wiring layer and at least one via plug connected to the at least one metal wiring layer.

The first cover insulating layer 140 may cover the second surface 104 of the first semiconductor substrate 100, that is, the top surface of the protrusion PRT.

The lower semiconductor chip DC may include the plurality of first recess regions RP and second recess regions RA in a top side thereof, that is, on a side of the second surface 104 of the first semiconductor substrate 100. The lower surfaces of the plurality of first recess regions RP and the lower surfaces of the second recess regions RA may be at a lower level than the second surface 104 of the first semiconductor substrate 100, and accordingly, the first semiconductor substrate 100 may be exposed.

The lower semiconductor chip DC may include the protrusion PRT defined by the second recess region RA and the stepped portion ST which is the side surface of the protrusion PRT forming a step between the lower surface of the second recess region RA and the top surface of the protrusion PRT.

The upper semiconductor chip UC may be stacked on the lower semiconductor chip DC. The upper semiconductor chip UC may include the second semiconductor substrate 200 and the second semiconductor device 210. The second semiconductor substrate 200 may include an active surface and an inactive surface opposite to the active surface.

The second semiconductor device 210 may be on the active surface of the second semiconductor substrate 200. The second semiconductor device 210 may include, for example, a memory device. In some embodiments, the second semiconductor device 210 may include a higher bandwidth memory (HBM) DRAM device.

The second cover insulating layer 240 may be on the active surface of the second semiconductor substrate 200. The second cover insulating layer 240 may be in contact with the first cover insulating layer 140 that covers the top surface of the projection PRT.

The upper semiconductor chip UC may be electrically connected to the plurality of first through-electrodes 130 via the plurality of bonded pads 155 which are across the first cover insulating layer 140 and the second cover insulating layer 240. The plurality of bonded pads 155 may fill the plurality of first recess regions RP defined by the protrusions PRT. The lower surface of each of the plurality of first recess regions RP and the lower surface of the second recess region RA may be at the same level as each other. Accordingly, the bottom surface of each of the plurality of bonded pads 155 and the lower surface of the second recess region RA may be at the same level as each other.

The upper semiconductor chip UC may be attached on the projection PRT of the lower semiconductor chip DC. The stepped portions ST, which are the side surface of the upper semiconductor chip UC and the side surface of the protrusion PRT, may be aligned with each other in the vertical direction. The upper semiconductor chip UC may fully overlap the protrusion PRT in the vertical direction.

The semiconductor package 1 may further include the molding member 300 surrounding the upper semiconductor chip UC on the lower semiconductor chip DC. The molding member 300 may fill the second recess region RA and cover the top surface of the lower semiconductor chip DC, the side surface of the upper semiconductor chip UC, and the side surface of the protrusion PRT. In some embodiments, the molding member 300 may expose the top surface of the upper semiconductor chip UC instead of covering the top surface. In some embodiments, a top surface of the molding member 300 and the top surface of the upper semiconductor chip UC may be coplanar with each other. A bottom surface of the molding member 300 may contact the lower surface of the second recess region RA. Thus, the bottom surface of the molding member 300 and the bottom surfaces of the plurality of bonded pads 155 may be at the same level.

In some embodiments, a heat dissipating member may be attached on the top surface of the upper semiconductor chip UC. A thermal interface material (TIM) layer may be between the top surface of the upper semiconductor chip UC and the heat dissipating member. In some embodiments, an electro-magnetic interference (EMI) shielding layer may be formed on a side surface and a top surface of the semiconductor package 1.

The semiconductor package 1 according to the inventive concepts may have improved alignment accuracy between the upper semiconductor chip UC and the lower semiconductor chip DC by using the stepped portion ST that is the side surface of the protrusion PRT as an alignment key in the process of stacking the upper semiconductor chip UC on the lower semiconductor chip DC.

Accordingly, even when the plurality of bonded pads 155 electrically connecting the upper semiconductor chip UC and the lower semiconductor chip DC have fine pitches, connection reliability may be obtained, and horizontal areas occupied by the plurality of bonded pads 155 and the plurality of first through-electrodes 130 connected to the plurality of bonded pads 155 may be reduced, and thus, a size of the semiconductor package 1 may be reduced. Alternatively, since it is possible to increase the number of the plurality of bonded pads 155 and the plurality of first through-electrodes 130 connected to the plurality of bonded pads 155 while reducing the size of the semiconductor package 1, the semiconductor package 1 having higher performance and/or higher speed operation may be provided.

Figure 3A:
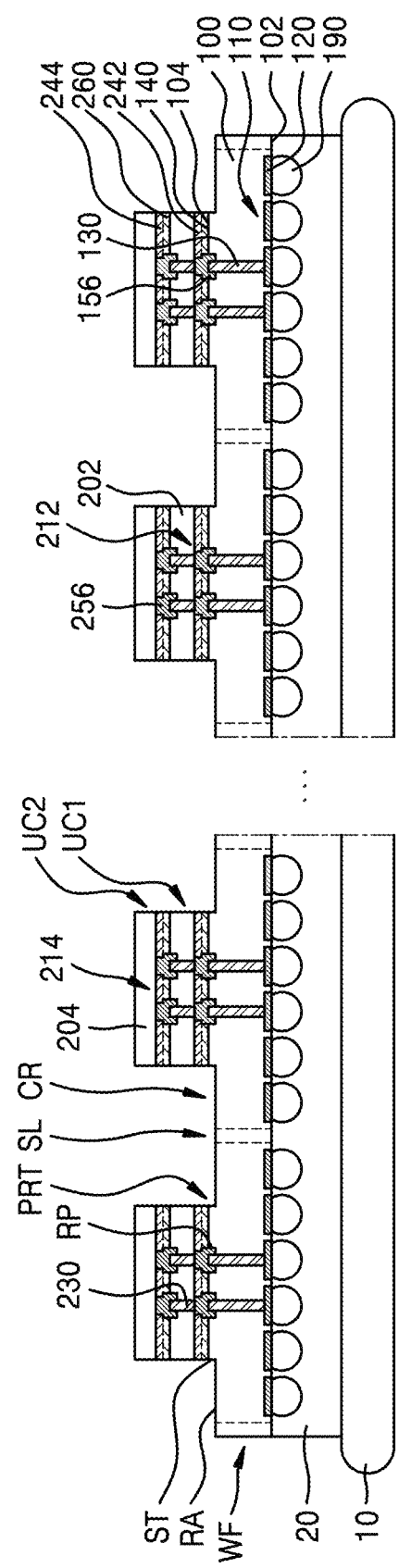
FIGS. 3A and 3B are cross-sectional views illustrating a method of manufacturing a semiconductor package according to embodiments.
Figure 3B:
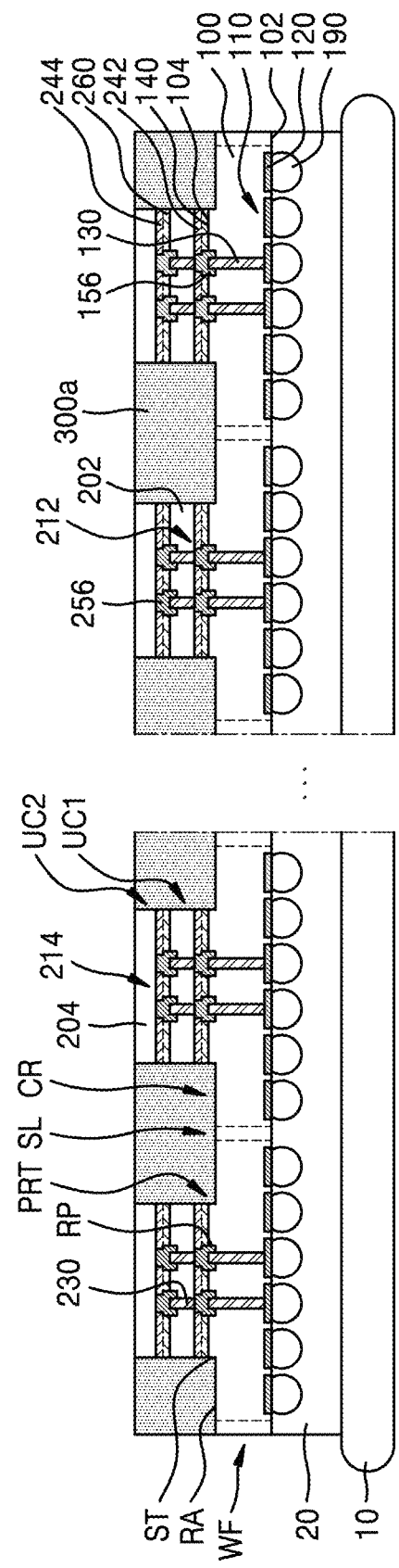
Figure 4:
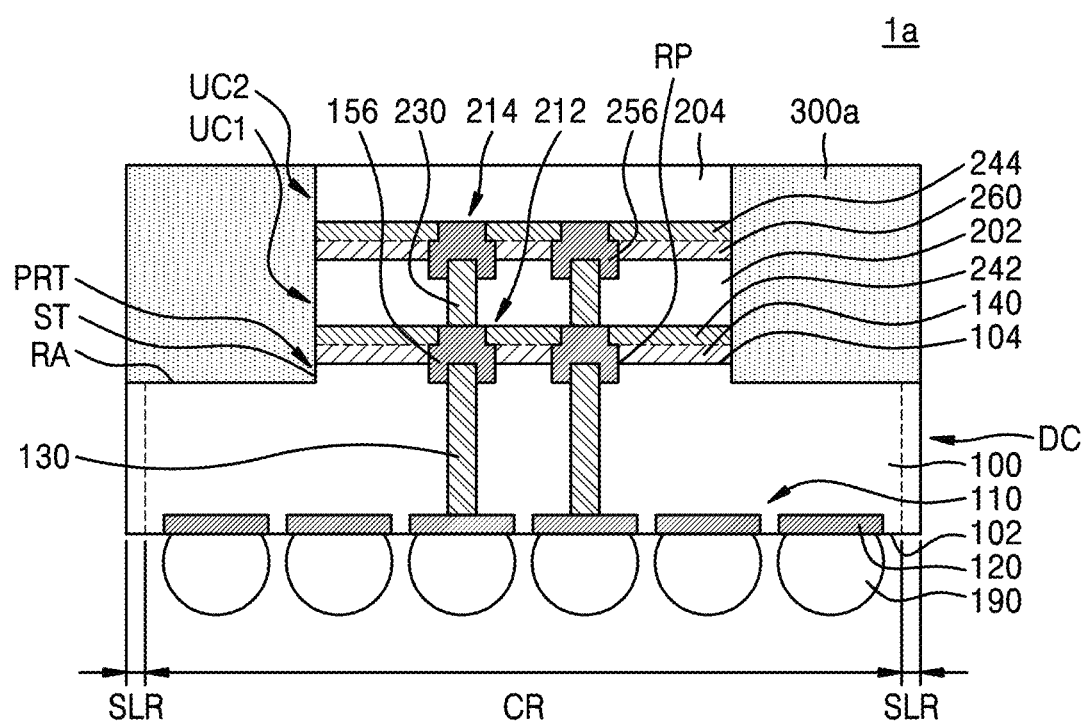
FIG. 4 is a cross-sectional view illustrating a semiconductor package according to embodiments.

FIGS. 3A and 3B are cross-sectional views illustrating a method of manufacturing a semiconductor package according to embodiments, and FIG. 4 is a cross-sectional view illustrating a semiconductor package according to embodiments. Duplicate descriptions given with reference to FIGS. 1A through 2 are omitted. FIG. 3A illustrates processes after the process illustrated in FIG. 1F.

Referring to FIG. 3A, a first upper semiconductor chip UC1 and a second upper semiconductor chip UC2 may be sequentially stacked on the protrusions PRT of each of the plurality of semiconductor chip regions CR of the wafer structure WF. A method of stacking the first upper semiconductor chip UC1 and the second upper semiconductor chip UC2 on the protrusions PRT of each of the plurality of semiconductor chip regions CR may be the same as or similar to the method of stacking the upper semiconductor chip UC on the protrusions PRT of each of the plurality of semiconductor chip regions CR as illustrated in FIG. 1G or 1H.

In some embodiments, the plurality of first upper semiconductor chips UC1 may be stacked on the projections PRT of each of the plurality of semiconductor chip regions CR by using the stepped portions ST as the alignment key, and the plurality of second upper semiconductor chip UC2 may be stacked on the plurality of first upper semiconductor chips UC1 by using the stepped portions ST and/or side surfaces of the first upper semiconductor chip UC1 as alignment keys.

In some other embodiments, after a plurality of stacked structures in which the second upper semiconductor chip UC2 is stacked on the first upper semiconductor chip UC1 are prepared, by using the stepped portion ST as the alignment key, the plurality of stacked structures may be stacked on the protrusions PRT of each of the plurality of semiconductor chip regions CR.

The lower semiconductor chip DC may include the first semiconductor substrate 100, the first semiconductor device 110, the plurality of first front connecting pads 120, the plurality of first through-electrodes 130, and/or the first cover insulating layer 140.

The first upper semiconductor chip UC1 may include a second semiconductor substrate 202, a second semiconductor device 212, a second cover insulating layer 242, and/or a third cover insulating layer 260, and the second upper semiconductor chip UC2 may include a third semiconductor substrate 204, a third semiconductor device 214, and/or a fourth cover insulating layer 244. The second semiconductor substrate 202 and the third semiconductor substrate 204 may be similar to the second semiconductor substrate 200 illustrated in FIG. 1G, the second semiconductor device 212 and the third semiconductor device 214 may be similar to the second semiconductor device 210 illustrated in FIG. 1G, the second cover insulating layer 242 and the fourth cover insulating layer 244 may be similar to the second cover insulating layer 240 illustrated in FIG. 1G, and thus, a detailed description thereof is omitted. The third cover insulating layer 260 may be substantially similar to the first cover insulating layer 140 illustrated in FIG. 1B. The third cover insulating layer 260 may cover a top surface, that is, an inactive surface, of the second semiconductor substrate 202 and may have a flat top surface.

The second cover insulating layer 242 may be in contact with the first cover insulating layer 140, and the fourth cover insulating layer 244 may be in contact with the third cover insulating layer 260.

The first upper semiconductor chip UC1 may further include a plurality of second through-electrodes 230 extending through at least a portion of the second semiconductor substrate 202. In some embodiments, the plurality of second through-electrodes 230 may partially protrude to the outside of the second semiconductor substrate 202 and extend into the third cover insulating layer 260.

The upper semiconductor chip UC may be electrically connected to the plurality of first through-electrodes 130 via the plurality of first bonded pads 156 penetrating the first cover insulating layer 140 and the second cover insulating layer 242. The second upper semiconductor chip UC2 may be electrically connected to the plurality of second through-electrodes 230 via a plurality of second bonded pads 256 penetrating the third cover insulating layer 260 and the fourth cover insulating layer 244. Each of the plurality of first bonded pads 156 and each of the plurality of second bonded pads 256 may be formed similarly to the plurality of bonded pads 155 described with reference to FIGS. 1I and 1J. The second upper semiconductor chip UC2 may be electrically connected to the first front connecting pad 120 via the plurality of second bonded pads 256, the plurality of second through-electrodes 230, the plurality of first bonded pads 156, and the plurality of first through-electrodes 130.

The plurality of first bonded pads 156 may fill the plurality of first recess regions RP defined by the protrusions PRT. The lower surface of each of the plurality of first recess regions RP and the lower surface of the second recess region RA may be at the same level as each other. Accordingly, a bottom surface of each of the plurality of first bonded pads 156 and the bottom surface of the second recess region RA may be at the same level as each other.

Referring to FIG. 3B, a molding member 300a covering the first upper semiconductor chip UC1 and the second upper semiconductor chip UC2 may be formed on the wafer structure WF. The molding member 300a may cover the top surface of the wafer structure WF, the side surface of the first upper semiconductor chip UC1, and a side surface of the second upper semiconductor chip UC2. In some embodiments, the molding member 300a may expose the top surface of the upper semiconductor chip UC without covering it.

Referring to FIGS. 3B and 4 together, by cutting the molding member 300a and the wafer structure WF along the scribe lane region SL, a plurality of semiconductor packages 1a that are separated from each other may be formed. The semiconductor package 1a may include the lower semiconductor chip DC, the first upper semiconductor chip UC1 attached on the lower semiconductor chip DC, and the second upper semiconductor chip UC2 attached on the first upper semiconductor chip UC1. The side surface of the first upper semiconductor chip UC1 and the side surface of the second upper semiconductor chip UC2 may be aligned with each other in the vertical direction. In FIG. 4, it is illustrated that two upper semiconductor chips, that is, the first upper semiconductor chip UC1 and the second upper semiconductor chip UC2, are stacked on the lower semiconductor chip DC, but the embodiment is not limited thereto. For example, the semiconductor package 1a may include the lower semiconductor chip DC and three or more upper semiconductor chips stacked on the lower semiconductor chip DC.

The first semiconductor device 110 of the lower semiconductor chip DC may include, for example, a CPU chip, a GPU chip, or an AP chip.

Each of second semiconductor devices 212 of the first upper semiconductor chip UC1 and each of third semiconductor devices 214 of the second upper semiconductor chip UC2 may include, for example, a memory device. In some embodiments, the second semiconductor device 212 and the third semiconductor device 214 may include HBM DRAM devices.

In some embodiments, a heat dissipating member may be attached on a top surface of the second upper semiconductor chip UC2. A TIM layer may be between the top surface of the second upper semiconductor chip UC2 and the heat dissipating member. In some embodiments, the EMI shielding layer may be formed on a side surface and a top surface of the semiconductor package 1a.

The semiconductor package 1a according to the inventive concepts may, by using the stepped portion ST, that is, the side surface of the protrusion PRT as the alignment key in the process of stacking the first upper semiconductor chip UC1, or the first upper semiconductor chip UC1 and the second upper semiconductor chip UC2, on the lower semiconductor chip DC, have improved alignment accuracy between the first upper semiconductor chip UC1 and the second upper semiconductor chip UC2, and the lower semiconductor chip DC.

Thus, it may be possible to reduce a size of the semiconductor package 1a and/or to provide higher performance and/or higher-speed operation to the semiconductor package 1a.

Figure 5A:
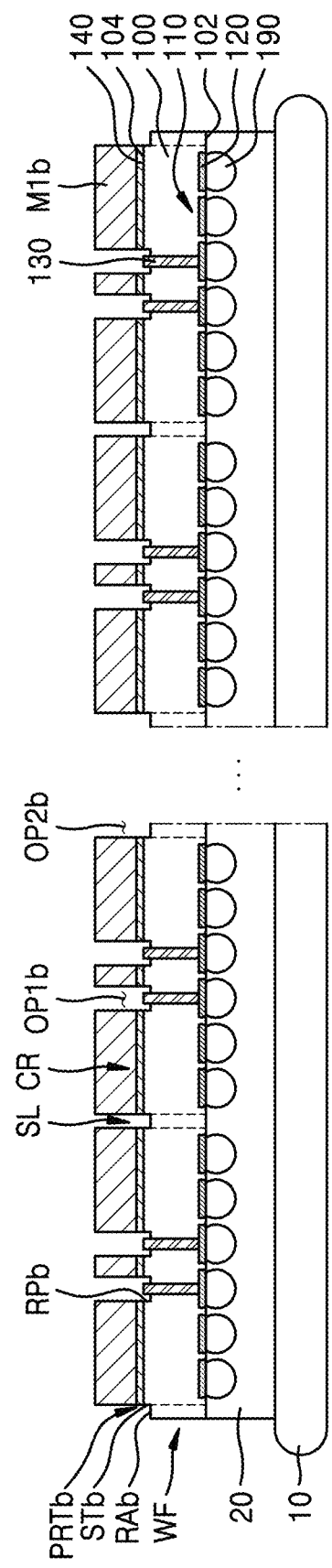
FIGS. 5A through 5C are cross-sectional views illustrating a method of manufacturing a semiconductor package according to embodiments.
Figure 5B:
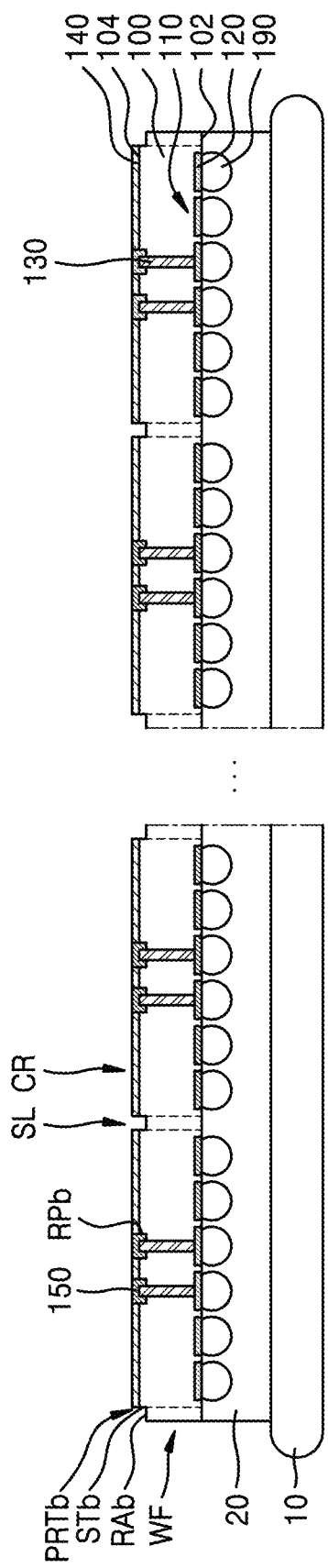
Figure 5C:
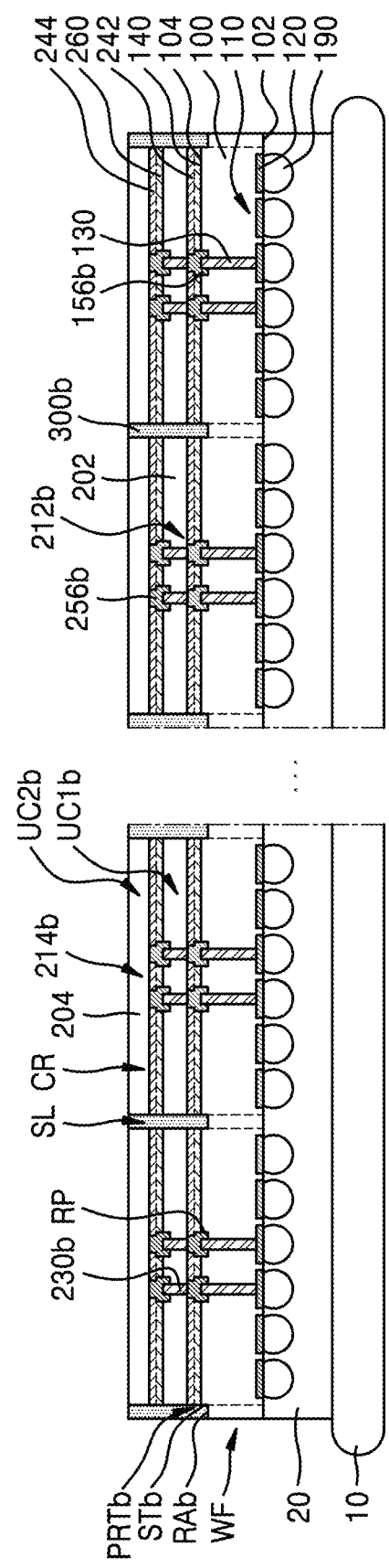
Figure 6:
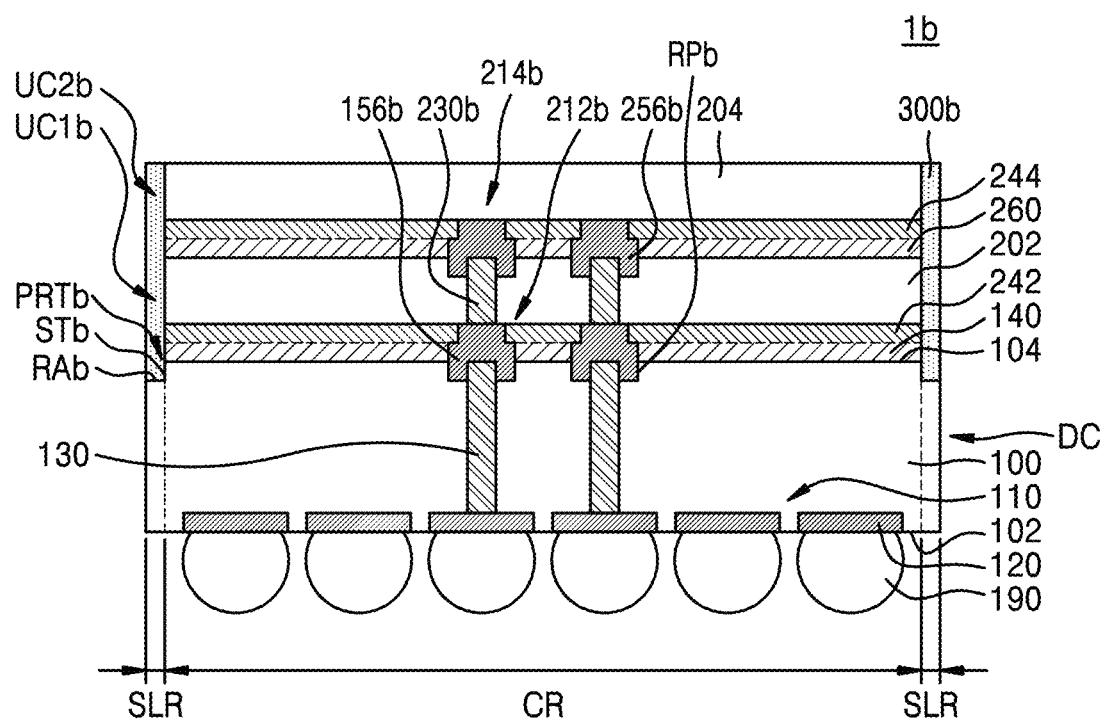
FIG. 6 is a cross-sectional view illustrating a semiconductor package according to embodiments.

FIGS. 5A through 5C are cross-sectional views illustrating a method of manufacturing a semiconductor package according to embodiments, and FIG. 6 is a cross-sectional view illustrating a semiconductor package according to embodiments. Duplicate descriptions given with reference to FIGS. 1A through 4 are omitted. FIG. 5A illustrates processes after the process illustrated in FIG. 1B.

Referring to FIG. 5A, a mask pattern M1b which includes a plurality of first openings OP1b and a plurality of a second opening OP2b exposing a portion of the first cover insulating layer 140 may be formed on the first cover insulating layer 140 of the wafer structure WF. The plurality of first openings OP1b may have a horizontal width greater than the horizontal width of the first through-electrodes 130 corresponding to the plurality of first through-electrodes 130, and the second opening OP2b may expose the scribe lane region SL. The second opening OP2b may surround the mask pattern M1b and the plurality of first openings OP1b.

Portions of the first cover insulating layer 140 and the first semiconductor substrate 100 may be removed by using the mask pattern M1b as an etch mask to expose the first semiconductor substrate 100 on lower surfaces of the removed portions, respectively, and then, a plurality of first recess regions RPb corresponding to the plurality of first openings OP1b and a second recess region RAb corresponding to the second openings OP2b may be formed. In some embodiments, the first semiconductor substrate 100 and the plurality of first through-electrodes 130 may be exposed together on lower surfaces of the plurality of first recess regions RPb. A horizontal width of the plurality of first recess regions RPb may be greater than the horizontal width of the plurality of first through-electrodes 130, and a horizontal width of the second recess regions RAb may be equal to or similar to a horizontal width of the scribe lane region SL. A protruding portion of the first semiconductor substrate 100 defined by the second recess region RAb may be referred to as a protrusion PRTb, and a side surface of the protrusion PRTb facing the second recess region RAb may be referred to as a stepped portion STb.

The lower surface of each of the plurality of first recess regions RPb and a lower surface of the second recess region RAb may be at the same level as each other.

Referring to FIG. 5B, a plurality of first back connecting pads 150, which fill the plurality of first recess regions RPb and are electrically connected to the plurality of first through-electrodes 130, may be formed.

Referring to FIG. 5C, a first upper semiconductor chip UC1b and a second upper semiconductor chip UC2b may be sequentially formed on the wafer structure WF to correspond to the protrusions PRTb of each of the plurality of semiconductor chip regions CR.

The first upper semiconductor chip UC1b may include the second semiconductor substrate 202, a second semiconductor device 212b, the second cover insulating layer 242 and the third cover insulating layer 260, and the upper semiconductor chip UC2b may include the third semiconductor substrate 204, a third semiconductor device 214b, and the fourth cover insulating layer 244.

The first upper semiconductor chip UC1b may further include a plurality of second through-electrodes 230b extending through at least a portion of the second semiconductor substrate 202. The plurality of second through-electrodes 230b may partially protrude to the outside of the second semiconductor substrate 202 and extend into the third cover insulating layer 260.

The upper semiconductor chip UC1b may be electrically connected to the plurality of first through-electrodes 130 via the plurality of first bonded pads 156b penetrating the first cover insulating layer 140 and the second cover insulating layer 242. The plurality of first bonded pads 156b may, after the plurality of first back connecting pads 150 as illustrated in FIG. 5B and a plurality of second front connecting pads (similar to 220 illustrated in FIG. 1I) of the first upper semiconductor chip UC1b are brought in contact with each other, be formed as an integral body by diffusion bonding through diffusion of metal atoms included in the plurality of first back connecting pads 150 and the plurality of second front connecting pads of the first upper semiconductor chip UC1b. The second upper semiconductor chip UC2b may be electrically connected to the plurality of second through-electrodes 230 via a plurality of second bonded pads 256b penetrating the third cover insulating layer 260 and the fourth cover insulating layer 244.

The plurality of first bonded pads 156b may fill the plurality of first recess regions RPb defined by the protrusions PRTb. The lower surface of each of the plurality of first recess regions RPb and the lower surface of the second recess region RAb may be at the same level as each other. Accordingly, a bottom surface of each of the plurality of first bonded pads 156b and the lower surface of the second recess region RAb may be at the same level as each other.

According to FIG. 5C a molding member 300b covering the first upper semiconductor chip UC1b and the second upper semiconductor chip UC2b may be formed on the wafer structure WF. The molding member 300b may cover the top surface of the wafer structure WF, a side surface of the first upper semiconductor chip UC1b, and a side surface of the second upper semiconductor chip UC2b. In some embodiments, the molding member 300b may expose a top surface of the upper semiconductor chip UC2b without covering it.

Referring to FIGS. 5C and 6 together, by cutting the molding member 300b and the wafer structure WF along the scribe lane region SL, a plurality of semiconductor packages 1b which are separated from each other may be formed. The semiconductor package 1b may include the lower semiconductor chip DC, the first upper semiconductor chip UC1b attached on the lower semiconductor chip DC, and the second upper semiconductor chip UC2b attached on the first upper semiconductor chip UC1b.

A horizontal width and a horizontal area of each of the first upper semiconductor chip UC1b and the second upper semiconductor chip UC2b may have the same value as the horizontal width and a horizontal area of the semiconductor chip region CR of the lower semiconductor chip DC.

The semiconductor package 1b may include the first upper semiconductor chip UC1b and the second upper semiconductor chip UC2b stacked on the lower semiconductor chip DC by a chip-to-wafer (C2W) method. In some embodiments, the lower semiconductor chip DC, the first upper semiconductor chip UC1b, and the second upper semiconductor chip UC2b may include the same kind of semiconductor chip.

In some embodiments, a heat dissipating member may be attached on the top surface of the second upper semiconductor chip UC2b. A TIM layer may be between the top surface of the second upper semiconductor chip UC2b and the heat dissipating member. In some embodiments, an electro-magnetic interference shielding layer may be formed on the side surface and the top surface of the semiconductor package 1b.

The semiconductor package 1b according to the inventive concepts may, by using the stepped portion STb, that is, the side surface of the protrusion PRTb as the alignment key in the process of stacking the first upper semiconductor chip UC1b, or the first upper semiconductor chip UC1b and the second upper semiconductor chip UC2b, on the lower semiconductor chip DC, may have improved alignment accuracy between the first upper semiconductor chip UC1b and the second upper semiconductor chip UC2b, and the lower semiconductor chip DC.

Thus, it may be possible to reduce a size of the semiconductor package 1b and/or to provide the semiconductor package 1b having higher performance and/or higher-speed operation.

Figure 7:
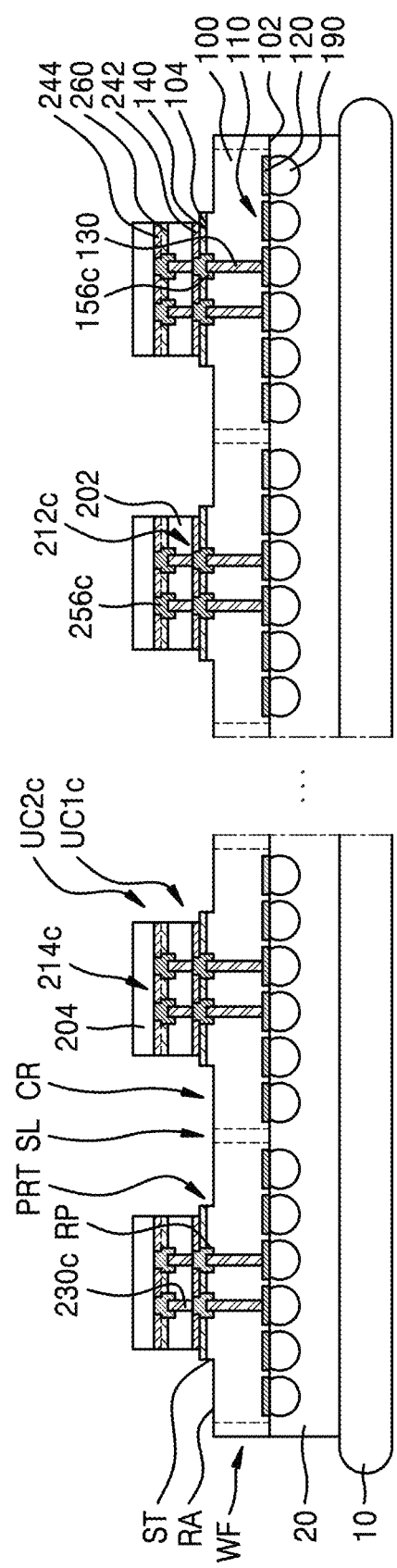
FIG. 7 is a cross-sectional view illustrating a method of manufacturing a semiconductor package according to embodiments.
Figure 8:
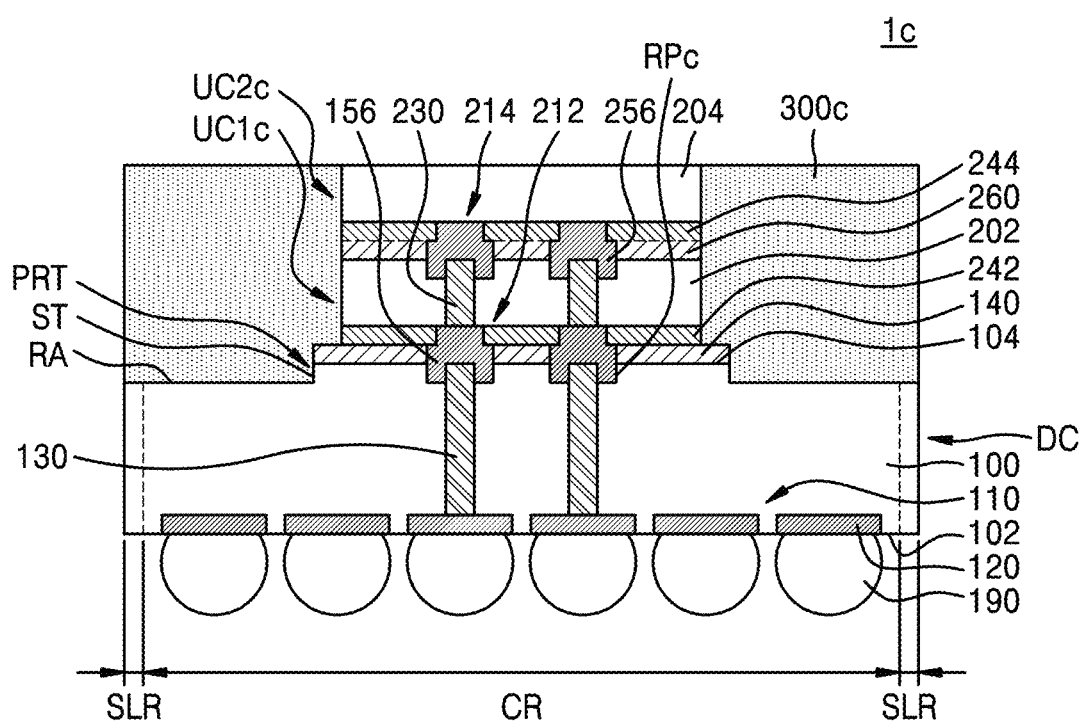
FIG. 8 is a cross-sectional view illustrating a semiconductor package according to embodiments.

FIG. 7 is a cross-sectional view illustrating a method of manufacturing a semiconductor package according to embodiments, and FIG. 8 is a cross-sectional view illustrating a semiconductor package according to embodiments. Duplicate descriptions given with reference to FIGS. 1A through 6 are omitted. FIG. 7 illustrates processes after the process illustrated in FIG. 1F.

Referring to FIG. 7, a first upper semiconductor chip UC1c and a second upper semiconductor chip UC2c may be sequentially formed on the wafer structure WF to correspond to the protrusions PRT of each of the plurality of semiconductor chip regions CR. A method of stacking the first upper semiconductor chip UC1c and the second upper semiconductor chip UC2c on the wafer structure WF to correspond to the protrusions PRT of each of the plurality of semiconductor chip regions CR may be similar to a method of stacking the upper semiconductor chip UC1 on the wafer structure WF to correspond to the protrusions PRT of each of the plurality of semiconductor chip regions CR as illustrated in FIG. 1G or FIG. 1H.

A horizontal width and a horizontal area of each of the first upper semiconductor chip UC1c and the second upper semiconductor chip UC2c may have values less than the horizontal width and the horizontal area of the protrusion PRT of the lower semiconductor chip DC. The side surface of the stepped portion ST and a side surface of the first upper semiconductor chip UC1c, and a side surface of the second upper semiconductor chip UC2c may not be aligned with each other in the vertical direction. The stepped portion ST may be used only as the alignment key. The side surfaces of the first upper semiconductor chip UC1c and the second upper semiconductor chip UC2c may be located inside the protrusion PRT of the lower semiconductor chip DC from the stepped portion ST.

The lower semiconductor chip DC may include the first semiconductor substrate 100, the first semiconductor device 110, the plurality of first front connecting pads 120, the plurality of first through-electrodes 130, and/or the first cover insulating layer 140.

The first upper semiconductor chip UC1c may include the second semiconductor substrate 202, the second semiconductor device 212, the second cover insulating layer 242 and/or the third cover insulating layer 260, and the upper semiconductor chip UC2c may include the third semiconductor substrate 204, the third semiconductor device 214, and/or the fourth cover insulating layer 244.

The first upper semiconductor chip UC1c may further include a plurality of second through-electrodes 230c extending through at least a portion of the second semiconductor substrate 202. The plurality of second through-electrodes 230c may partially protrude to the outside of the second semiconductor substrate 202 and extend into the third cover insulating layer 260.

The first upper semiconductor chip UC1c may be electrically connected to the plurality of first through-electrodes 130 via the plurality of first bonded pads 156c penetrating the first cover insulating layer 140 and the second cover insulating layer 242. The second upper semiconductor chip UC2c may be electrically connected to the plurality of second through-electrodes 230c via a plurality of second bonded pads 256c penetrating the third cover insulating layer 260 and the fourth cover insulating layer 244. Each of the plurality of first bonded pads 156c and each of the plurality of second bonded pads 256c may be formed similarly to the plurality of bonded pads 155 described with reference to FIGS. 1I and 1J. The second upper semiconductor chip UC2c may be electrically connected to the first front connecting pad 120 via the plurality of second bonded pads 256c, the plurality of second through-electrodes 230c, the plurality of first bonded pads 156c, and the plurality of first through-electrodes 130.

The plurality of first bonded pads 156c may fill the plurality of first recess regions RP defined by the protrusions PRT. The lower surface of each of the plurality of first recess regions RP and the lower surface of the second recess region RA may be at the same level as each other. Accordingly, a bottom surface of each of the plurality of first bonded pads 156c and the lower surface of the second recess region RA may be at the same level as each other.

Referring to FIGS. 7 and 8, a molding member 300c covering the first upper semiconductor chip UC1c and the second upper semiconductor chip UC2c may be formed on the wafer structure WF. The molding member 300c may cover the top surface of the wafer structure WF, the top surface of the protrusion PRT, a side surface of the upper semiconductor chip UC1c, and a side surface of the second upper semiconductor chip UC2c. In some embodiments, the molding member 300c may expose a top surface of the upper semiconductor chip UC2c without covering it.

Thereafter, by cutting the molding member 300c and the wafer structure WF along the scribe lane region SL, a plurality of semiconductor packages 1c which are separated from each other may be formed. The semiconductor package 1c may include the lower semiconductor chip DC, the first upper semiconductor chip UC1c attached on the lower semiconductor chip DC, and the second upper semiconductor chip UC2c attached on the first upper semiconductor chip UC1c.

The first semiconductor device 110 of the lower semiconductor chip DC may include, for example, a CPU chip, a GPU chip, or an AP chip.

Each of second semiconductor devices 212c of the first upper semiconductor chip UC1c and each of third semiconductor devices 214c of the second upper semiconductor chip UC2c may include, for example, a memory device. In some embodiments, the second semiconductor device 212c and the third semiconductor device 214c may include HBM DRAM devices.

In some embodiments, a heat dissipating member may be attached on the top surface of the second upper semiconductor chip UC2c. A TIM layer may be between the top surface of the second upper semiconductor chip UC2c and the heat dissipating member. In some embodiments, an EMI shielding layer may be formed on a side surface and a top surface of the semiconductor package 1c.

The semiconductor package 1c according to the inventive concepts may, by using the stepped portion ST, which is the side surface of the protrusion PRT, in the process of stacking the first upper semiconductor chip UC1c, or the first upper semiconductor chip UC1c and the second upper semiconductor chip UC2c on the lower semiconductor chip DC, may have improved alignment accuracy between the first upper semiconductor chip UC1c and the second upper semiconductor chip UC2, and the lower semiconductor chip DC.

Thus, it may be possible to reduce a size of the semiconductor package 1c or to provide the semiconductor package 1c having higher performance and/or higher-speed operation.

Figure 9A:
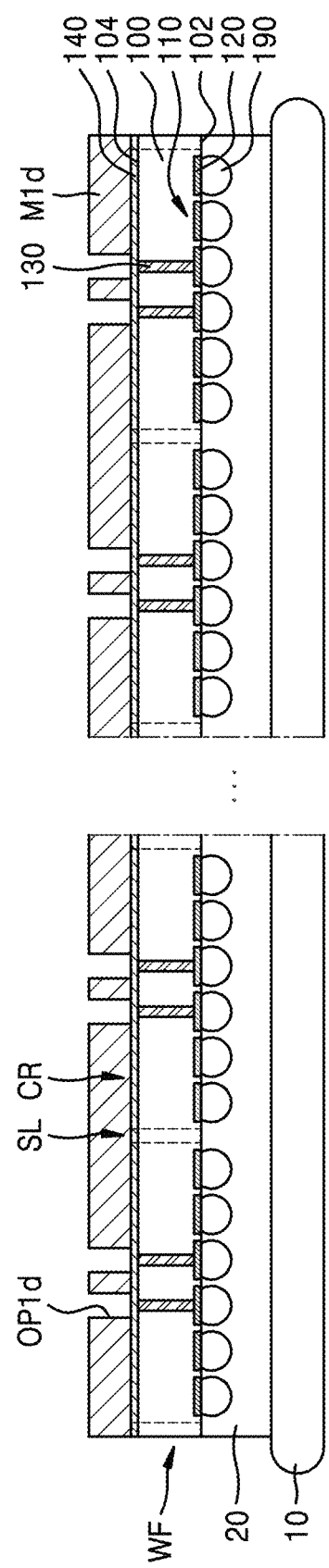
FIGS. 9A through 9D are cross-sectional views illustrating a method of manufacturing a semiconductor package according to embodiments.
Figure 9B:
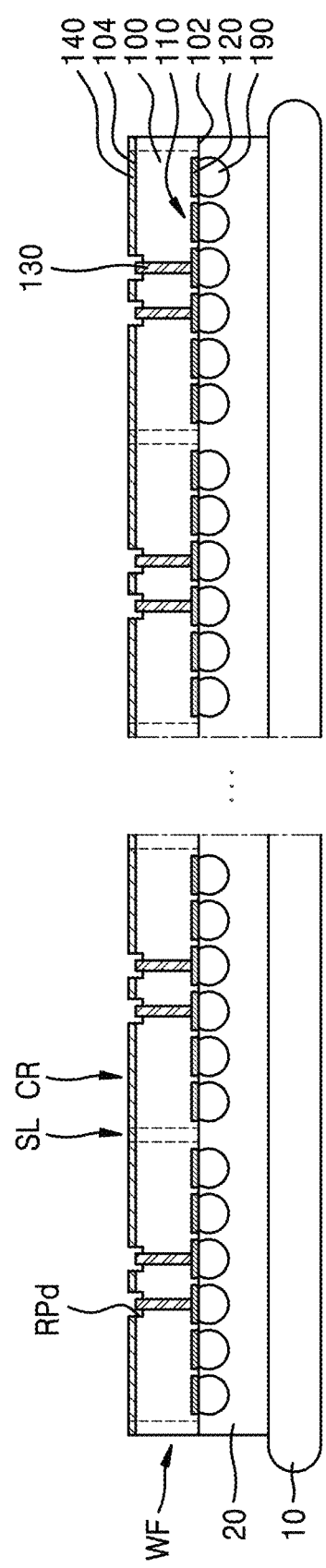
Figure 9C:
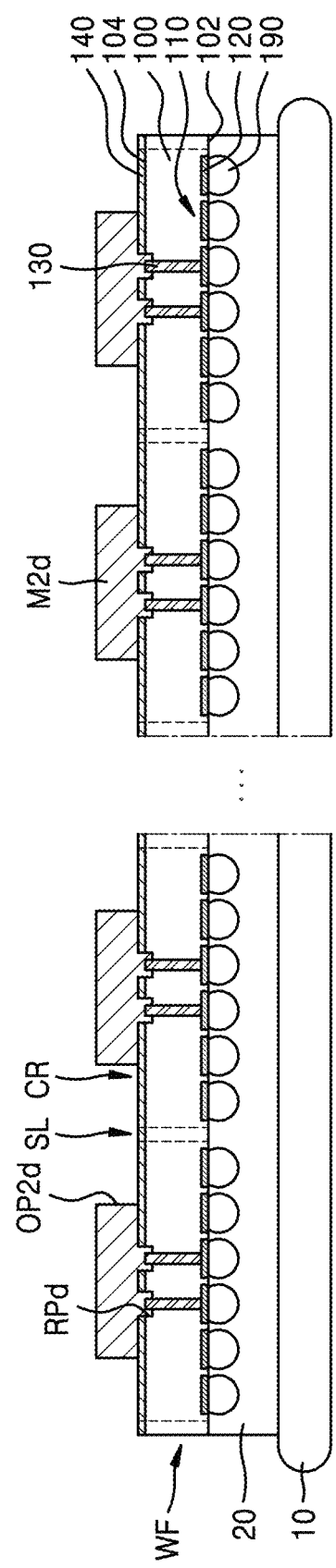
Figure 9D:
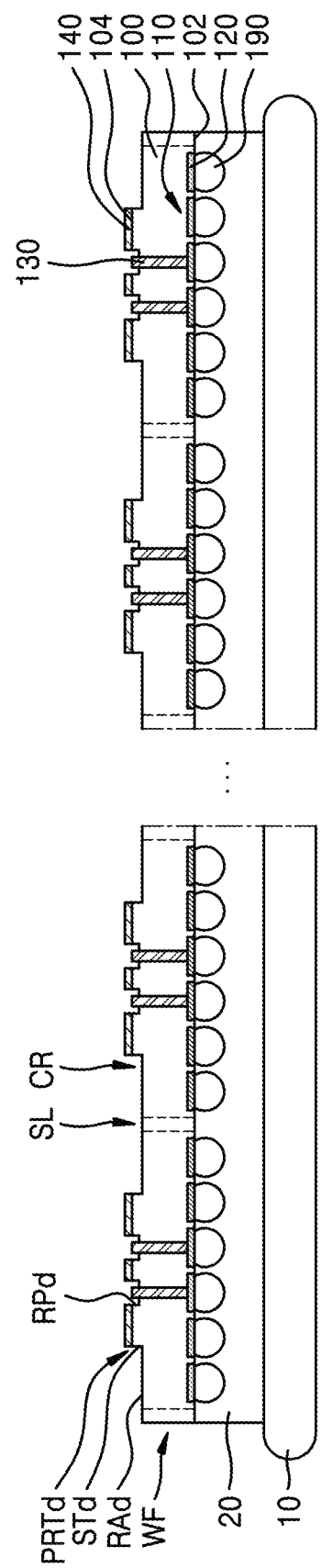
Figure 10A:
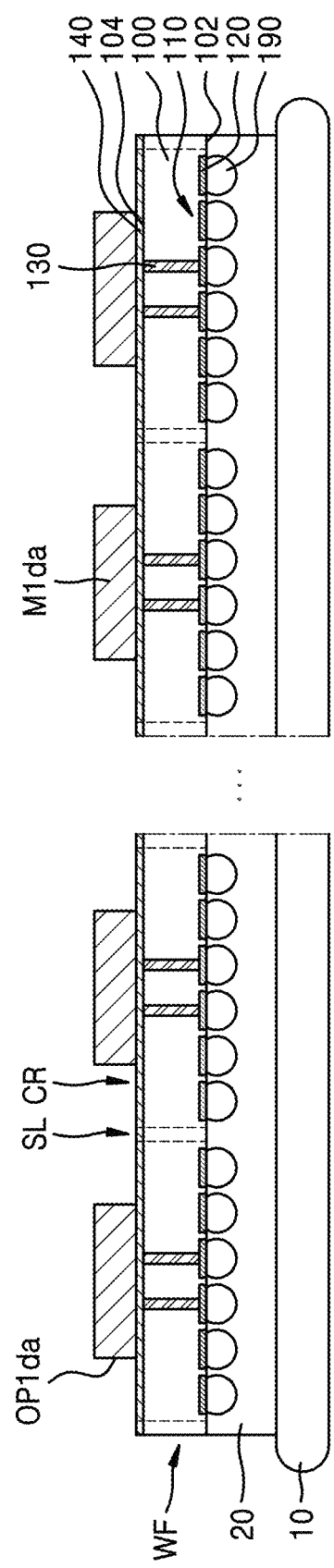
FIGS. 10A through 10D are cross-sectional views illustrating another method of manufacturing a semiconductor package according to embodiments.
Figure 10B:
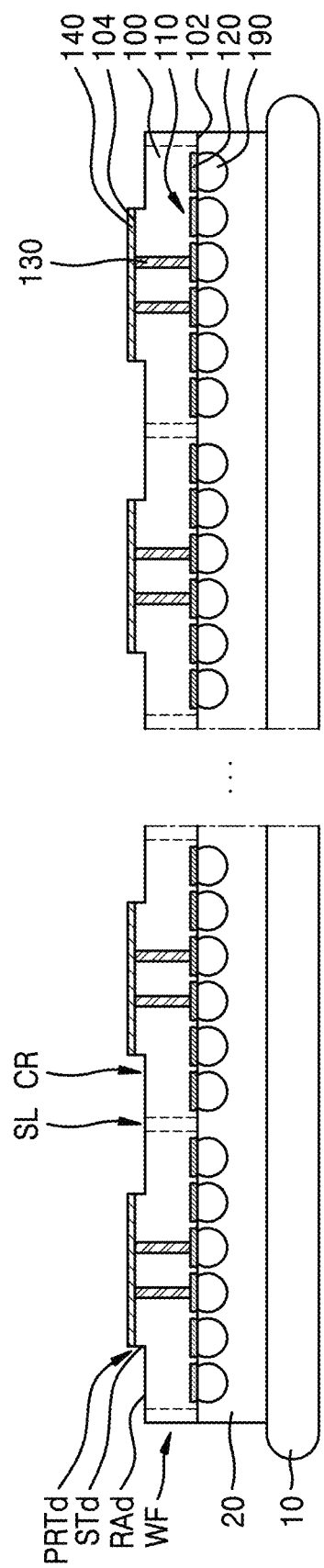
Figure 10C:
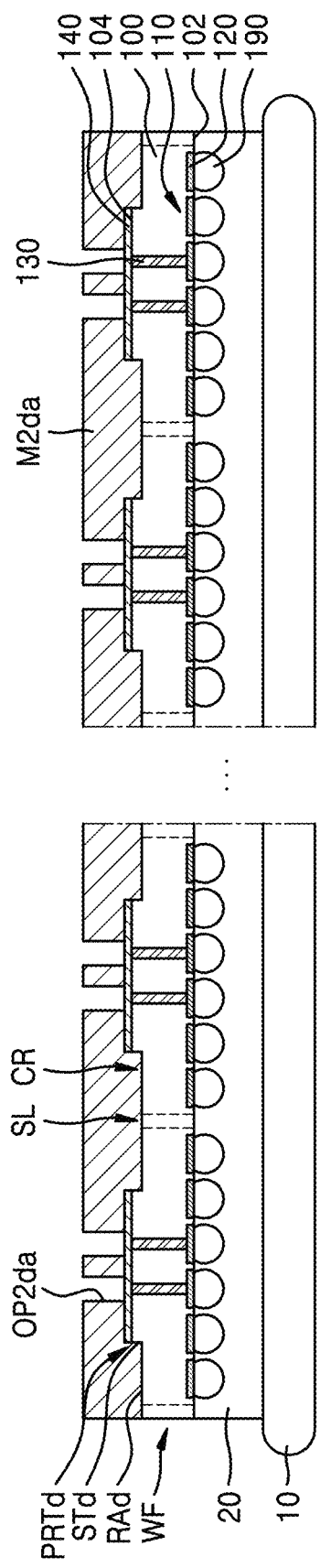
Figure 10D:
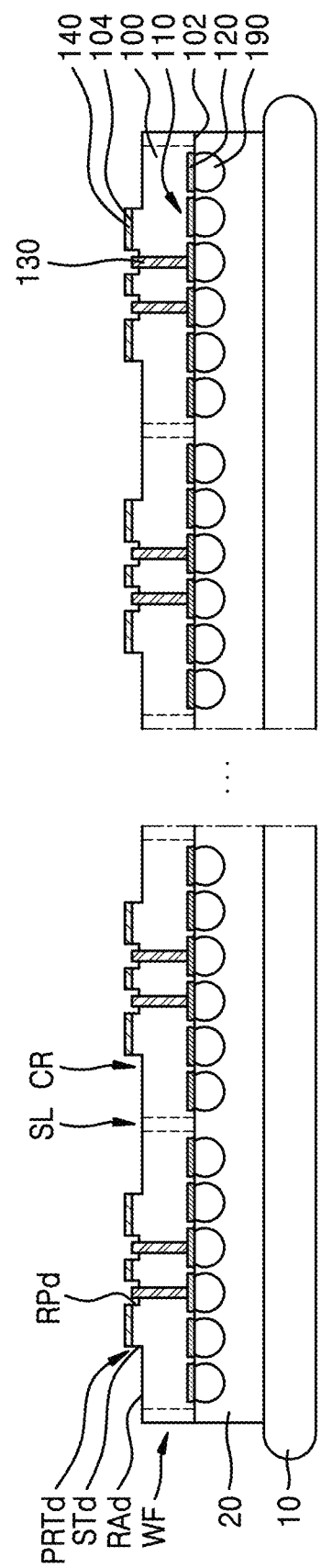
Figure 11:
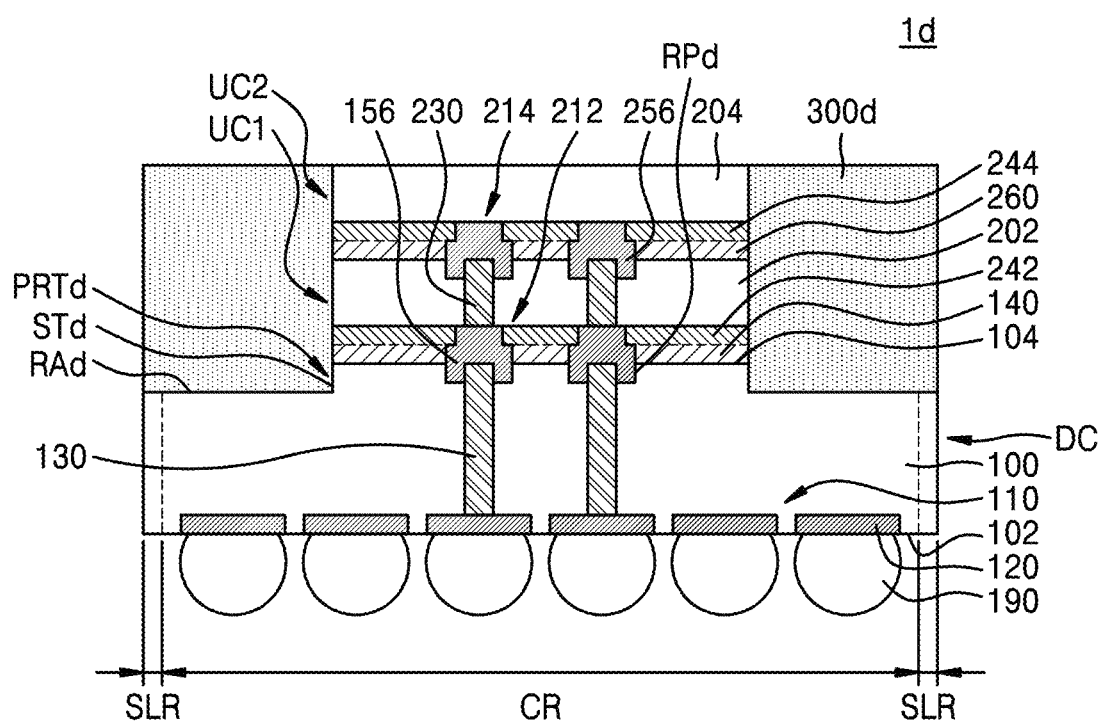
FIG. 11 is a cross-sectional view illustrating a semiconductor package according to embodiments.

FIGS. 9A through 9D are cross-sectional views illustrating a method of manufacturing a semiconductor package according to embodiments, FIGS. 10A through 10D are cross-sectional views illustrating another method of manufacturing a semiconductor package according to embodiments, and FIG. 11 is a cross-sectional view illustrating a semiconductor package according to embodiments. Duplicate descriptions given with reference to FIGS. 1A through 4 are omitted. FIGS. 9A and 10A illustrate processes after the process illustrated in FIG. 1B.

Referring to FIG. 9A, a first mask pattern M1d which includes a plurality of first openings OP1d exposing a portion of the first cover insulating layer 140 on the first cover insulating layer 140 of the wafer structure WF may be formed. The plurality of first openings OP1d may have a horizontal width greater than the horizontal width of the first through-electrodes 130.

Referring to FIGS. 9A and 9B together, by removing portions of the first cover insulating layer 140 and the first semiconductor substrate 100 by using the first mask pattern M1d as an etching mask, the first semiconductor substrate 100 may be exposed on lower surfaces of the removed portions, and a plurality of first recess regions RPd corresponding to the plurality of first openings OP1d may be formed. In some embodiments, the first semiconductor substrate 100 and the plurality of first through-electrodes 130 may be exposed together on lower surfaces of the plurality of first recess regions RPd. A horizontal width of the plurality of first recess regions RPd may be greater than the horizontal width of the plurality of first through-electrodes 130.

Referring to FIG. 9C, a second mask pattern M2d including a second opening OP2d that exposes a portion of the first cover insulating layer 140 on the first cover insulating layer 140 on an output of the process in FIG. 9B may be formed. The second opening OP2d may expose the edge portion of the semiconductor chip region CR and the scribe lane region SL. The second mask pattern M2d may cover all of the plurality of first recess regions RPd.

Referring to FIGS. 9C and 9D together, by removing portions of the first cover insulating layer 140 and the first semiconductor substrate 100 by using a second mask pattern M2d as an etching mask, the first semiconductor substrate 100 may be exposed on lower surfaces of the removed portions, and a plurality of second recess regions RAd corresponding to a plurality of second openings OP2d may be formed. The second recess region RAd may extend from the scribe lane region SL in the horizontal direction toward the inside of the semiconductor chip region CR. A protruding portion of the first semiconductor substrate 100 defined by the second recess region RAd may be referred to as a protrusion PRTd, and a side surface of the protrusion PRTd facing the second recess region RAd may be referred to as a stepped portion STd.

The lower surface of each of the plurality of first recess regions RPd may be at a level higher than a lower surface of the second recess region RAd.

Referring to FIG. 10A, a first mask pattern M1da which includes a plurality of first openings OP1da exposing a portion of the first cover insulating layer 140 on the first cover insulating layer 140 of the wafer structure WF may be formed. The first opening OP1da may expose the edge portion of the semiconductor chip region CR and the scribe lane region SL.

Referring to FIGS. 10A and 10B together, by removing portions of the first cover insulating layer 140 and the first semiconductor substrate 100 by using the first mask pattern M1da as an etching mask, the first semiconductor substrate 100 may be exposed on lower surfaces of the removed portions, and the recess region RAd corresponding to the first openings OP1da may be formed. The second recess region RAd may extend from the scribe lane region SL in the horizontal direction toward the inside of the semiconductor chip region CR. A protruding portion of the first semiconductor substrate 100 defined by the second recess region RAd may be referred to as the protrusion PRTd, and the side surface of the protrusion PRTd facing the second recess region RAd may be referred to as the stepped portion STd.

Referring to FIG. 10C, a second mask pattern M2da which includes a plurality of second openings OP2da each exposing a portion of the first cover insulating layer 140 on the protrusion PRTd on an output of the process in FIG. 10B may be formed. The plurality of second openings OP2da may have a horizontal width greater than the horizontal width of the first through-electrodes 130. The second mask pattern M2da may cover all of the second recess regions RAd.

Referring to FIGS. 10A and 10B together, by removing portions of the first cover insulating layer 140 and the first semiconductor substrate 100 by using the second mask pattern M2da as an etching mask, the plurality of first recess regions RAd corresponding to the plurality of second openings OP2da may be formed. In some embodiments, the first semiconductor substrate 100 and the plurality of first through-electrodes 130 may be exposed together on the lower surfaces of the plurality of first recess regions RPd. The horizontal width of the plurality of first recess regions RPd may be greater than the horizontal width of the plurality of first through-electrodes 130.

The lower surface of the second recessed area RAd may be located at a higher level than each of the plurality of first recess regions RPd.

Referring to FIGS. 9D and 11 together or referring to FIGS. 10D and 11 together, a semiconductor package 1d may be formed by performing a method similar to the method described with reference to FIGS. 3A through 4.

The semiconductor package 1d may include the lower semiconductor chip DC, the first upper semiconductor chip UC1 attached on the lower semiconductor chip DC, and the second upper semiconductor chip UC2 attached on the first upper semiconductor chip UC1.

The semiconductor package 1d may further include the first upper semiconductor chip UC1 on the lower semiconductor chip DC and a molding member 300d surrounding the second upper semiconductor chip UC2. The molding member 300d may cover the top surface of the lower semiconductor chip DC, the side surface of the first upper semiconductor chip UC1, the side surface of the second upper semiconductor chip UC2, and the side surface of the protrusion PRT. In some embodiments, the molding member 300d may expose the top surface of the upper semiconductor chip UC2 without covering it. In some embodiments, the top surface of the molding member 300d and the top surface of the upper semiconductor chip UC2 may be coplanar with each other The lower surface of each of the plurality of first recess regions RPd may be at a level higher than the bottom surface of the second recess region RAd.

The semiconductor package 1d according to the inventive concepts may, by using the stepped portion ST, which is the side surface of the protrusion PRT, in the process of stacking the first upper semiconductor chip UC1, or the first upper semiconductor chip UC1 and the second upper semiconductor chip UC2 on the lower semiconductor chip DC, may have improved alignment accuracy between the first upper semiconductor chip UC1 and the second upper semiconductor chip UC2, and the lower semiconductor chip DC.

Thus, it may be possible to reduce a size of the semiconductor package 1d or to provide the semiconductor package 1d having higher performance and/or a higher-speed operation.

Figure 12A:
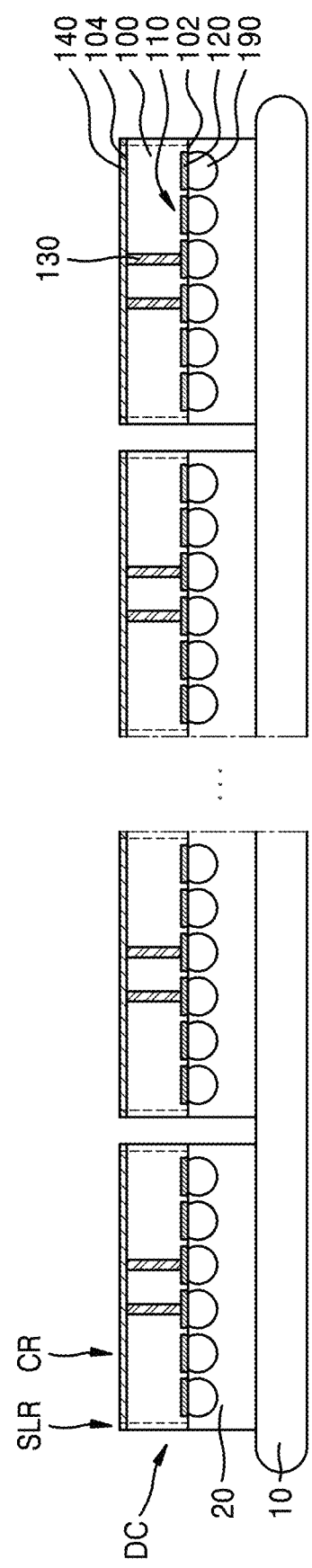
FIGS. 12A and 12B are cross-sectional views illustrating a method of manufacturing a semiconductor package according to embodiments.
Figure 12B:
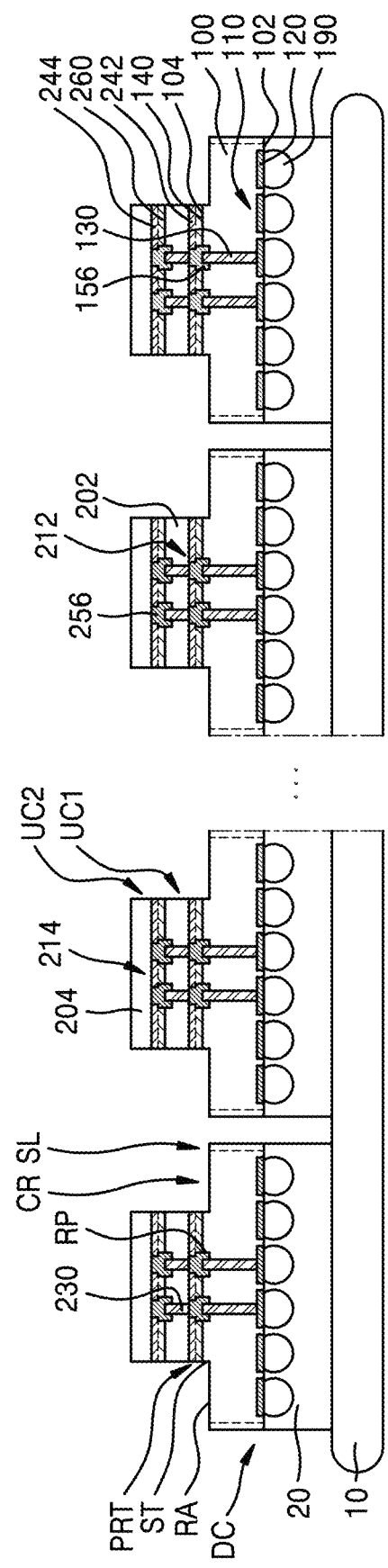

FIGS. 12A and 12B are cross-sectional views illustrating a method of manufacturing a semiconductor package according to embodiments, and duplicate descriptions given with reference to FIGS. 1A through 4 are omitted.

Referring to FIG. 12A, the plurality of lower semiconductor chips DC may be attached to the first carrier substrate 10 with the first adhesive film 20 therebetween.

Referring to FIG. 12B, with reference to the processes described with reference to FIGS. 1C through 1H, with respect to an output of the operation in FIG. 12A, the protrusion PRT may be formed in each of the plurality of lower semiconductor chips DC, and the first upper semiconductor chip UC1 and the second upper semiconductor chip UC2 may be sequentially stacked on each of the plurality of protrusions PRT. Thereafter, the semiconductor package 1a illustrated in FIG. 4 may be formed through the processes described with reference to FIG. 3B and FIG. 4.

The semiconductor package 1a may be formed in the C2W manner as described with reference to FIGS. 3A and 3B, or may be formed in a chip-to-chip (C2C) method described with reference to FIGS. 12A and 12B.

Figure 13A:
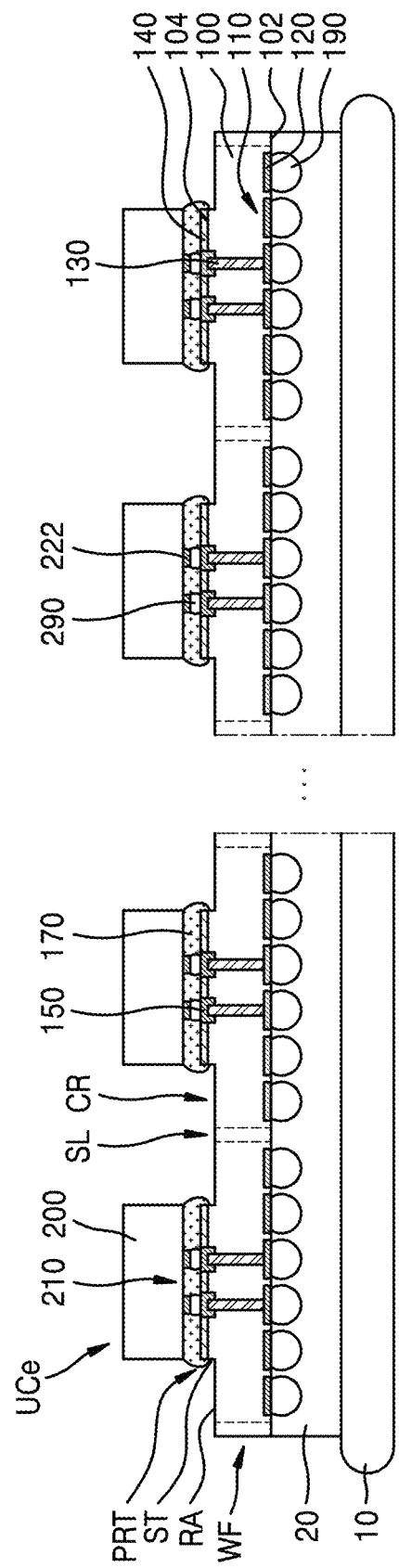
FIGS. 13A and 13B are cross-sectional views illustrating a method of manufacturing a semiconductor package according to embodiments.
Figure 13B:
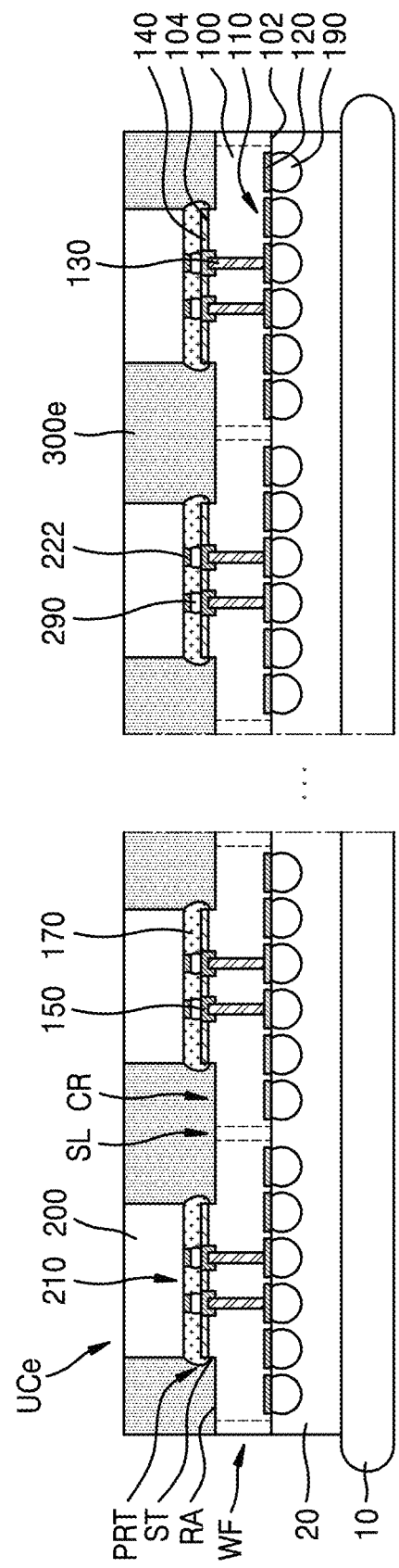
Figure 14:
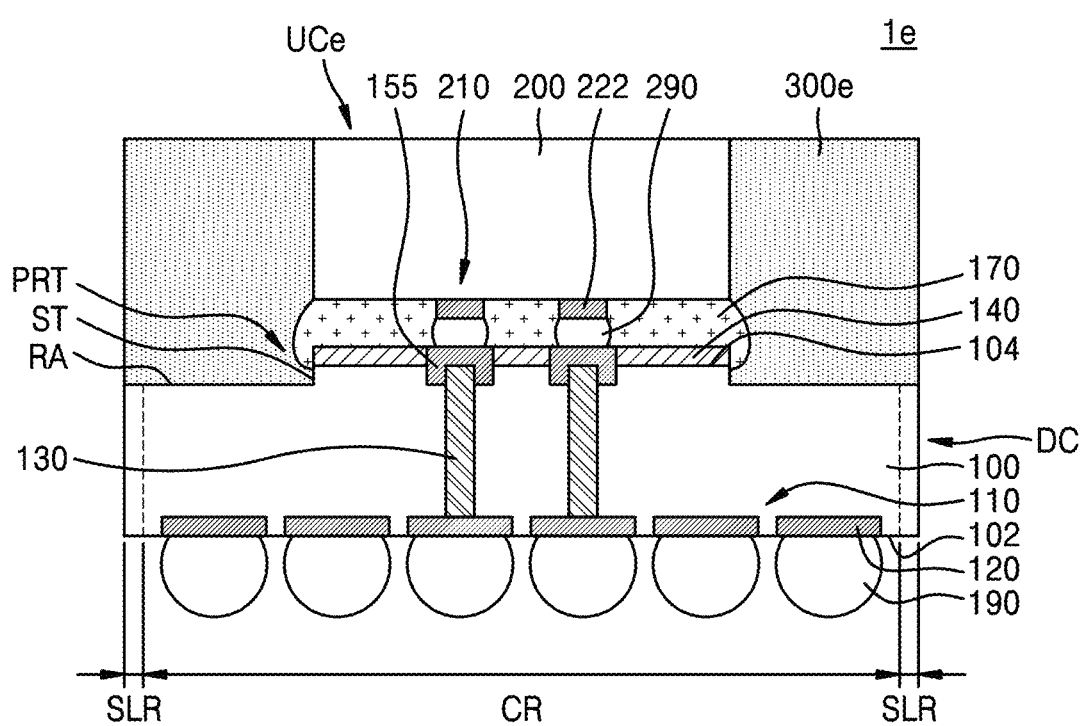
FIG. 14 is a cross-sectional view illustrating a semiconductor package according to embodiments.

FIGS. 13A and 13B are cross-sectional views illustrating a method of manufacturing a semiconductor package according to embodiments, and FIG. 14 is a cross-sectional view illustrating a semiconductor package 1e according to embodiments. Duplicate descriptions with reference to FIGS. 1A through 2 are omitted. FIG. 13A illustrates processes after the process illustrated in FIG. 1F.

Referring to FIG. 13A, an upper semiconductor chip UCe may be attached on the wafer structure WF to correspond to the protrusions PRT of each of the plurality of semiconductor chip regions CR.

The upper semiconductor chip UCe may include the second semiconductor substrate 200, the second semiconductor device 210, and the plurality of second front connecting pads 222.

A plurality of chip connecting terminals 290 may be between the plurality of second front connecting pads 222 and the plurality of first back connecting pads 150. The plurality of chip connecting terminals 290 may include, for example, a bump or a solder ball.

An underfill material layer 170 surrounding the plurality of second front connecting pads 222 may be between the protrusion PRT of each of the plurality of semiconductor chip regions CR of the wafer structure WF and the upper semiconductor chip UCe. The underfill material layer 170 may include, for example, an insulating film such as NCF or ACF.

The underfill material layer 170 may cover at least a portion of the side surface of the protrusion PRT due to pressure and/or heat applied in a process of attaching the upper semiconductor chip UCe on the protrusion PRT.

FIG. 13A illustrates that one upper semiconductor chip UCe is stacked on the protrusion PRT of each of the plurality of semiconductor chip regions CR of the wafer structure WF, but the embodiment is not limited thereto. Two or more upper semiconductor chips UCe may be stacked on the protrusions PRT of each of the plurality of semiconductor chip regions CR, and in this case, the remaining upper semiconductor chips UCe except the upper semiconductor chip UCe at the uppermost position among the two or more upper semiconductor chips UCe may include the first through-electrode 130 for an electrical connection with the upper semiconductor chip UCe on an upper side.

Referring to FIG. 13B, a molding member 300e surrounding the upper semiconductor chip UCe on the wafer structure WF may be formed. The molding member 300e may cover the top surface of the wafer structure WF, the side surface of the protrusion PRT, a side surface of the upper semiconductor chip UCe, and a surface of the underfill material layer 170. In some embodiments, the molding member 300e may expose a top surface of the upper semiconductor chip UCe without covering it.

Referring to FIGS. 13B and 14 together, by cutting the molding member 300e and the wafer structure WF along the scribe lane region SL, a plurality of semiconductor packages 1e which are separated from each other may be formed. The semiconductor package 1e may include the lower semiconductor chip DC, the upper semiconductor chip UCe attached on the lower semiconductor chip DC, and the underfill material layer 170 filling a space between the lower semiconductor chip DC and the upper semiconductor chip UCe.

The underfill material layer 170 may fill between the top surface of the protrusion PRT and a bottom surface of the upper semiconductor chip UCe, and may protrude outwardly from a space between the top surface of the protrusion PRT and the bottom surface of the upper semiconductor chip UCe. In some embodiments, the underfill material layer 170 may extend along the side surface of the protrusion PRT from the space between the top surface of the projection PRT and the bottom surface of the upper semiconductor chip UCe, and may cover a portion of the side surface of the protrusion PRT.

Figure 15:
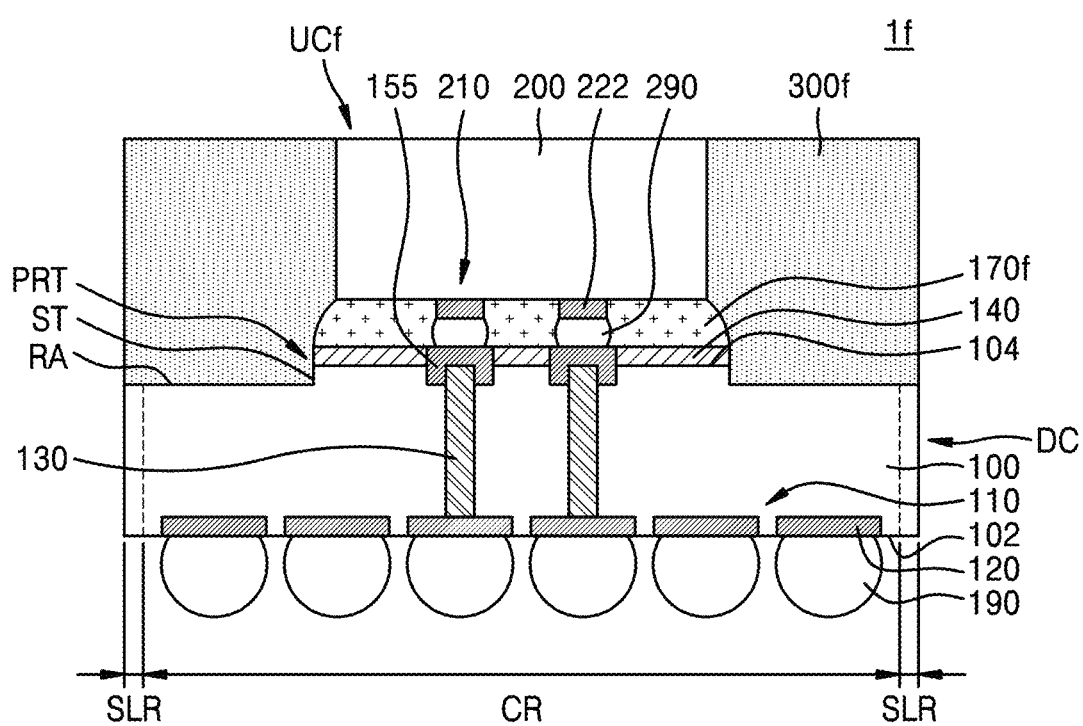
FIG. 15 is a cross-sectional view illustrating a semiconductor package according to embodiments.

FIG. 15 is a cross-sectional view illustrating a semiconductor package 1f according to embodiments.

Referring to FIG. 15, the semiconductor package 1e may include the lower semiconductor chip DC, an upper semiconductor chip UCf attached on the lower semiconductor chip DC, the underfill material layer 170 filling a space between the lower semiconductor chip DC and the upper semiconductor chip UCf, and a molding member 300f.

A horizontal width and a horizontal area of the upper semiconductor chip UCf may be less than the horizontal width and the horizontal area of the protrusion PRT of the lower semiconductor chip DC, respectively. Thus, the upper semiconductor chip UCf may overlap a portion of the top surface of the protrusion PRT in the vertical direction, and may not overlap the portion of the top surface of the protrusion PRT.

The underfill material layer 170f may fill a space between the protrusion PRT and the upper semiconductor chip UCf, and may extend outwardly to cover at least a portion of the protrusion PRT that does not overlap the upper semiconductor chip UCf in the vertical direction from a space between the protrusion PRT and a bottom surface of the upper semiconductor chip UCf. The underfill material layer 170f may protrude outwardly from a lower portion of the upper semiconductor chip UCf in the vertical direction. In some embodiments, the underfill material layer 170f may cover a portion of the side surface of the protrusion PRT, similarly to what is illustrated in FIG. 14.

The molding member 300f may cover the top surface of the lower semiconductor chip DC, the side surface of the protrusion PRT, the side surface of the upper semiconductor chip UCe, and a surface of the underfill material layer 170f.

Figure 16A:
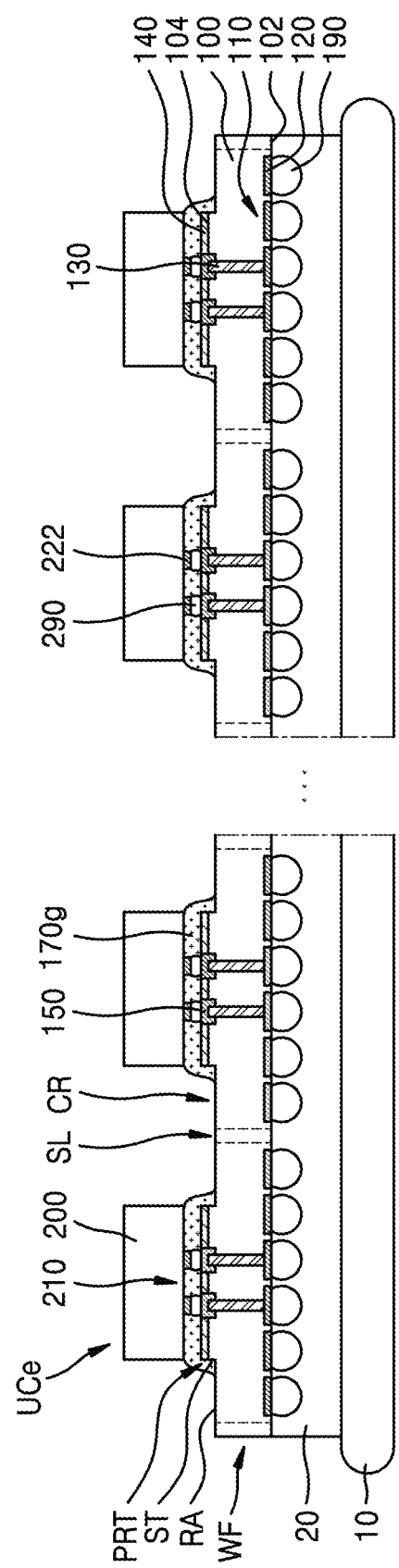
FIGS. 16A and 16B are cross-sectional views illustrating a method of manufacturing a semiconductor package according to embodiments.
Figure 16B:
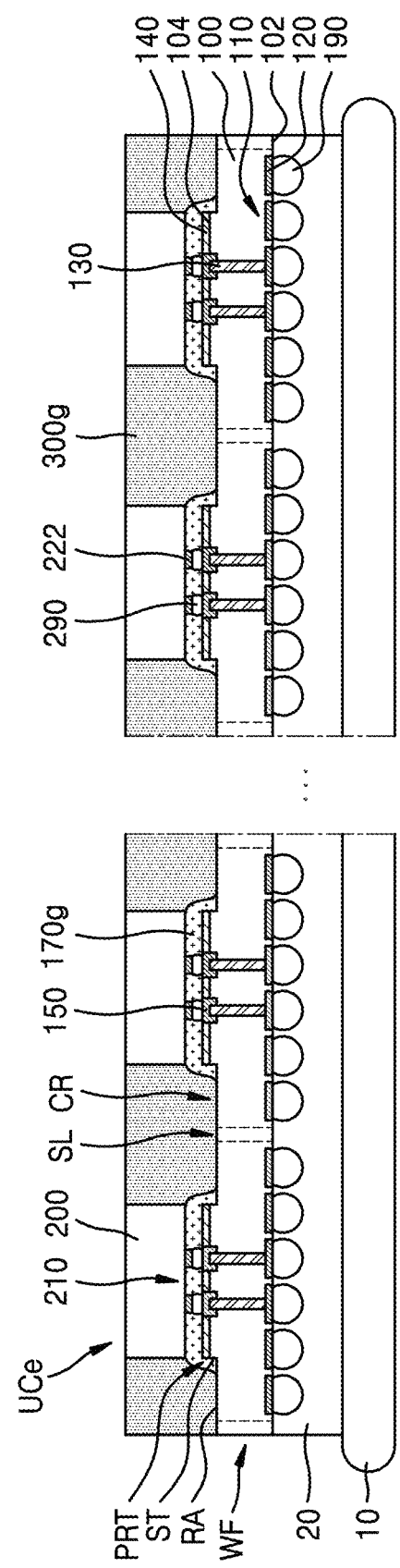
Figure 17:
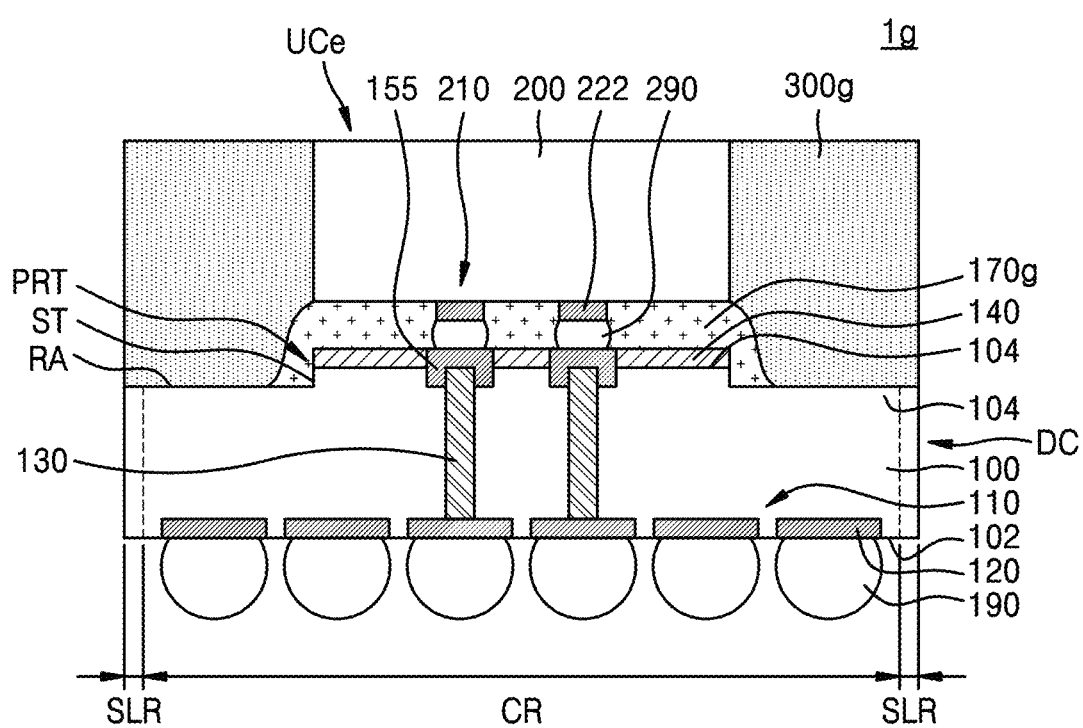
FIG. 17 is a cross-sectional view illustrating a semiconductor package according to embodiments.

FIGS. 16A and 16B are cross-sectional views illustrating a method of manufacturing a semiconductor package according to embodiments, and FIG. 17 is a cross-sectional view illustrating a semiconductor package 1g according to embodiments. Duplicate descriptions given with reference to FIGS. 1A through 2 and 16A through 17 are omitted. FIG. 16A illustrates processes after the process illustrated in FIG. 1F.

Referring to FIG. 16A, the upper semiconductor chip UCe may be attached on the wafer structure WF to correspond to the protrusion PRT of each of the plurality of semiconductor chip regions CR. The upper semiconductor chip UCe may include the second semiconductor substrate 200, the second semiconductor device 210, and the plurality of second front connecting pads 222. The plurality of chip connecting terminals 290 may be between the plurality of second front connecting pads 222 and the plurality of first back connecting pads 150.

An underfill material layer 170g surrounding the plurality of second front connecting pads 222 may be between the protrusion PRT of each of the plurality of semiconductor chip regions CR of the wafer structure WF and the upper semiconductor chip UCe. The underfill material layer 170g may include, for example, epoxy resin, instant adhesive, thermosetting adhesive, laser curing adhesive, ultrasonic curing adhesive, NCP, etc.

Due to pressure and/or heat applied in a process of attaching the upper semiconductor chip UCe on the protrusion PRT, the underfill material layer 170g may cover the side surface of the protrusion PRT and a portion of the lower surface of the second recess region RA.

Referring to FIG. 16B, a molding member 300g surrounding the upper semiconductor chip UCe on the wafer structure WF may be formed. The molding member 300g may cover the top surface of the wafer structure WF, the side surface of the protrusion PRT, the side surface of the upper semiconductor chip UCe, and a surface of the underfill material layer 170g. In some embodiments, the molding member 300g may expose the top surface of the upper semiconductor chip UCe without covering it.

Referring to FIGS. 16B and 17 together, by cutting the molding member 300g and the wafer structure WF along the scribe lane region SL, the plurality of semiconductor packages 1g which are separated from each other may be formed. The semiconductor package 1g may include the lower semiconductor chip DC, the upper semiconductor chip UCe attached on the lower semiconductor chip DC, and the underfill material layer 170g filling the space between the lower semiconductor chip DC and the upper semiconductor chip UCe.

The underfill material layer 170g may fill the space between the protrusion PRT and the bottom surface of the upper semiconductor chip UCe, extend from the space between the protrusion PRT and the bottom surface of the upper semiconductor chip UC to the side surface of the protrusion PRT and to the lower surface of the second recess region RA, and cover the side surface of the protrusion PRT and a portion of the lower surface of the second recess region RA.

Figure 18:
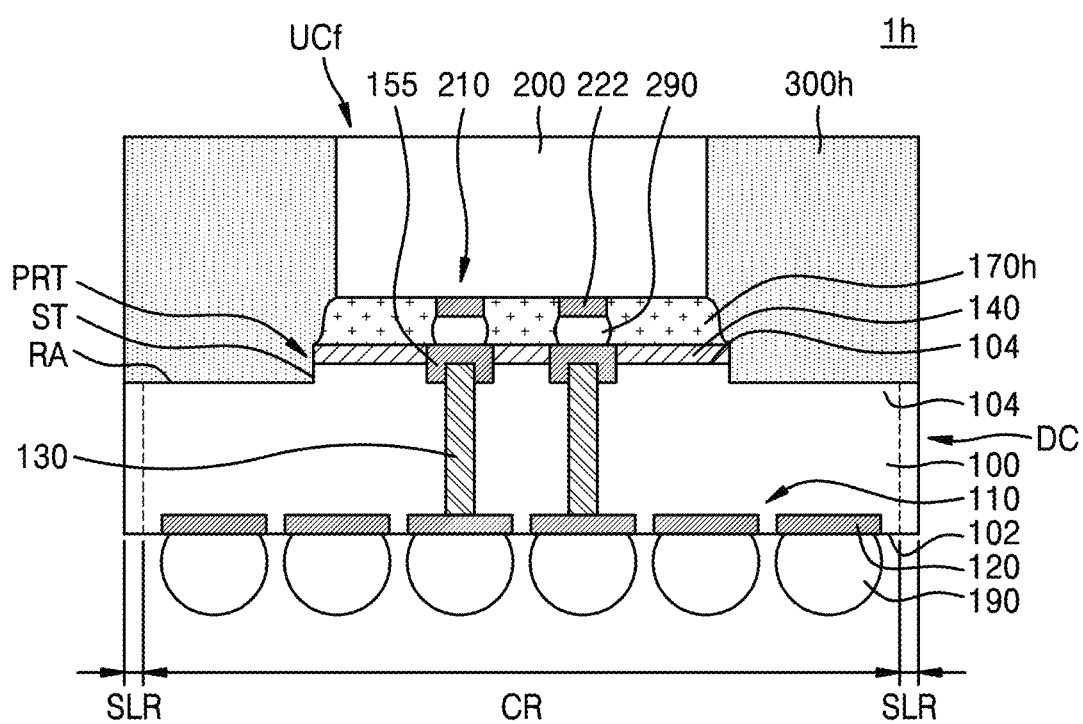
FIG. 18 is a cross-sectional view illustrating a semiconductor package according to embodiments.

FIG. 18 is a cross-sectional view illustrating a semiconductor package 1h according to embodiments.

Referring to FIG. 18, the semiconductor package 1h may include the lower semiconductor chip DC, an upper semiconductor chip UCf attached on the lower semiconductor chip DC, and an underfill material layer 170h filling a space between the lower semiconductor chip DC and the upper semiconductor chip UCf, and a molding member 300h.

The horizontal width and the horizontal area of the upper semiconductor chip UCf may be less than the horizontal width and the horizontal area of the protrusion PRT of the lower semiconductor chip DC, respectively. Accordingly, the upper semiconductor chip UCf may overlap a portion of the top surface of the protrusion PRT in the vertical direction, and may not overlap the remaining portion of the top surface of the protrusion PRT.

The underfill material layer 170h may fill a space between the protrusion PRT and the upper semiconductor chip UCf, and may extend to cover all of the protrusion PRT that does not overlap the upper semiconductor chip UCf in the vertical direction from a space between the protrusion PRT and the bottom surface of the upper semiconductor chip UCf. The underfill material layer 170h may protrude outwardly from a lower portion of the upper semiconductor chip UCf in the vertical direction. In some embodiments, the underfill material layer 170h may cover a portion of the side surface of the protrusion PRT, similarly to what is illustrated in FIG. 17.

The molding member 300h may cover the top surface of the lower semiconductor chip DC, the side surface of the protrusion PRT, a side surface of the upper semiconductor chip UCf, and a surface of the underfill material layer 170h.

FIGS. 19A-D through 21A-C are cross-sectional views conceptually illustrating a process of forming the bonded pad 155, the first bonded pad 156, and the second bonded pad 256 in a method of manufacturing a semiconductor package according to embodiments. A process of forming the bonded pad 155 is described with reference to FIGS. 1E through 1I together.

Referring to FIGS. 19A-19D, as illustrated in FIG. 19A, the first back connecting pad 150 and the second front connecting pad 220 may have different horizontal widths, and by adjusting conditions of a planarization process for forming the first back connecting pad 150 and the second front connecting pad 220, one top surface of the first back connecting pad 150 and the second front connecting pad 220 may protrude convexly, while another top surface of the first back connecting pad 150 and the second front connecting pad 220 may recess concavely. As illustrated in FIG. 19B, while the heat at the first temperature is applied, the first cover insulating layer 140 and the second cover insulating layer 240 may be in contact with each other. In some embodiments, the first cover insulating layer 140 and the second cover insulating layer 240 may be bonded together to each other in a covalent bond. When the heat at the second temperature is applied, as illustrated in FIG. 19C, each of the first back connecting pad 150 and the second front connecting pad 220 may expand and come into contact with each other. Then, as illustrated in FIG. 19D, the bonded pad 155 which becomes an integral body through diffusion of metal atoms included in each of the first back connecting pad 150 and the second front connecting pad 220 may be formed.

Referring to FIGS. 20A-20D, as illustrated in FIG. 20A, the first back connecting pad 150 and the second front connecting pad 220 may have the same horizontal width, and by adjusting conditions of the planarization process for forming the first back connecting pad 150 and the second front connecting pad 220, one top surface of the first back connecting pad 150 and the second front connecting pad 220 may protrude convexly, while another top surface of the first back connecting pad 150 and the second front connecting pad 220 may recess concavely. As illustrated in FIG. 20B, while the heat at the first temperature is applied, the first cover insulating layer 140 and the second cover insulating layer 240 may be in contact with each other. In some embodiments, the first cover insulating layer 140 and the second cover insulating layer 240 may be bonded together to each other in a covalent bond. When the heat at the second temperature is applied, as illustrated in FIG. 20C, each of the first back connecting pad 150 and the second front connecting pad 220 may expand and come into contact with each other. Then, as illustrated in FIG. 20D, the plurality of bonded pads 155 which become an integral body through diffusion of metal atoms included in each of the first back connecting pad 150 and the second front connecting pad 220 may be formed.

Referring to FIGS. 21A-21C, as illustrated in FIG. 21A, the top surfaces of the first back connecting pad 150 and the second front connecting pad 220 may be located coplanar with the top surfaces of the first cover insulation layer 140 and the second cover insulation layer 240, respectively. In some embodiments, the first back connecting pad 150 and the second front connecting pad 220 may have the same horizontal width. In some other embodiments, the first back connecting pad 150 and the second front connecting pad 220 may have different horizontal widths. As illustrated in FIG. 21B, while the heat at the first temperature is applied, the first cover insulating layer 140 and the second cover insulating layer 240 may be in contact with each other. In some embodiments, the first cover insulating layer 140 and the second cover insulating layer 240 may be bonded together to each other in the covalent bond. When the heat of the second temperature is applied, as illustrated in FIG. 21C, the plurality of bonded pads 155 which are diffusion bonded to become an integral body through diffusion of metal atoms included in each of the first back connecting pad 150 and the second front connecting pad 220 may be formed.

A semiconductor package according to the inventive concepts may have improved alignment accuracy between an upper semiconductor chip and a lower semiconductor chip by using a stepped portion, which is a side surface of a protrusion, as an alignment key in a process of stacking the upper semiconductor chip on the lower semiconductor chip.

Therefore, since the upper semiconductor chip and the lower semiconductor chip are electrically connected by a connecting member having a fine pitch, a size of the semiconductor package may be reduced, or the semiconductor package with higher performance and/or higher-speed operation may be provided.

While the present inventive concepts have been particularly shown and described with reference to example embodiments thereof, the present inventive concepts are not limited to the example embodiments, and various changes and modifications may be made by those of ordinary skill in the art without departing from the spirit and scope of the present inventive concepts.

What is claimed is:

1. A semiconductor package comprising:
a lower semiconductor chip comprising a first semiconductor substrate, which comprises a first semiconductor device on an active surface thereof and a protrusion defined by a recess region on an inactive surface thereof opposite to the active surface, a plurality of external connecting pads on a bottom surface of the first semiconductor substrate, and a plurality of through-electrodes electrically connected to the plurality of external connecting pads; and
at least one upper semiconductor chip stacked on the protrusion of the lower semiconductor chip and electrically connected to the plurality of through-electrodes, the at least one upper semiconductor chip comprising a second semiconductor substrate which comprises a second semiconductor device on an active surface thereof,
wherein the at least one upper semiconductor chip has a horizontal area less than a horizontal area of the lower semiconductor chip to be superimposed on at least a portion of the protrusion in a vertical direction, and
wherein a horizontal area of the protrusion is equal to or greater than the horizontal area of the upper semiconductor chip.

2. The semiconductor package of claim 1, wherein the lower semiconductor chip further comprises a first cover insulating layer covering a top surface of the protrusion, and the at least one upper semiconductor chip further comprises a second cover insulating layer covering the active surface of the second semiconductor substrate,
the semiconductor package further comprising a plurality of bonded pads electrically connecting a space between the upper semiconductor chip and the plurality of through-electrodes penetrating the first cover insulating layer and the second cover insulating layer.

3. The semiconductor package of claim 2, wherein a bottom surface of the plurality of bonded pads and a lower surface of the recess region are at the same level.

4. The semiconductor package of claim 2, wherein a lower surface of the recess region is at a level lower than the bottom surface of the plurality of bonded pads.

5. The semiconductor package of claim 1, wherein a side surface of the at least one upper semiconductor chip is aligned with a side surface of the protrusion in a vertical direction.

6. The semiconductor package of claim 1, wherein the at least one upper semiconductor chip and the protrusion overlap each other in the vertical direction.

7. The semiconductor package of claim 1, further comprising: a plurality of chip connecting terminals electrically connecting the plurality of through-electrodes to the at least one upper semiconductor chip; and an underfill material layer configured to fill a space between a top surface of the protrusion and the at least one upper semiconductor chip to surround the plurality of chip connecting terminals, the underfill material layer extending outwardly therefrom.

8. The semiconductor package of claim 7, wherein the underfill material layer covers at least a portion of a side surface of the protrusion.

9. The semiconductor package of claim 7, wherein the underfill material layer covers a side surface of the protrusion and a portion of a lower surface of the recess region adjacent to the protrusion.

10. The semiconductor package of claim 7, further comprising a molding member configured to cover a top surface of the lower semiconductor chip, a side surface of the at least one upper semiconductor chip, and a side surface of the protrusion, the molding member being configured to fill the recess region.

11. A semiconductor package comprising:
a lower semiconductor chip comprising a first semiconductor substrate, which comprises a first semiconductor device on an active surface thereof and a protrusion defined by a first recess region on an inactive surface thereof opposite to the active surface, a first cover insulating layer configured to cover a top surface of the protrusion, a plurality of external connecting pads on a bottom surface of the first semiconductor substrate, and a plurality of first through-electrodes electrically connected to the plurality of external connecting pads and extending through at least a portion of the protrusion;
at least one upper semiconductor chip comprising a second semiconductor substrate, stacked on the protrusion of the lower semiconductor chip and comprising a second semiconductor device on an active surface thereof, and a second cover insulating layer configured to cover the active surface of the second semiconductor substrate; and a plurality of bonded pads across the first cover insulating layer and the second cover insulating layer, the plurality of bonded pads electrically connecting the at least one upper semiconductor chip to the plurality of first through-electrodes.

12. The semiconductor package of claim 11, wherein all of the at least one upper semiconductor chips are configured to overlap the protrusion in a vertical direction.

13. The semiconductor package of claim 12, wherein a horizontal area of the at least one upper semiconductor chip is identical to a horizontal area of a top surface of the protrusion.

14. The semiconductor package of claim 11, wherein the plurality of bonded pads are diffusion-bonded to each other to form an integral body.

15. The semiconductor package of claim 11, wherein the at least one upper semiconductor chip comprises a first upper semiconductor chip in which respective side surfaces thereof are aligned with each other in a vertical direction, and a second upper semiconductor chip stacked on the first upper semiconductor chip.

16. The semiconductor package of claim 15, wherein the first upper semiconductor chip comprises a plurality of second through-electrodes electrically connected to the second upper semiconductor chip.

17. The semiconductor package of claim 11, wherein the first semiconductor substrate comprises a plurality of second recess regions filled by the plurality of bonded pads, and a lower surface of the first recess region and a lower surface of the plurality of second recess regions are at an identical level.

18. A semiconductor package comprising:
a lower semiconductor chip comprising a first semiconductor substrate which comprises a first semiconductor device on an active surface thereof and a plurality of first through-electrodes configured to penetrate the first semiconductor substrate, the lower semiconductor chip comprising protrusions on an inactive surface opposite to the active surface of the first semiconductor substrate; and a first upper semiconductor chip comprising each of side surfaces thereof aligned with side surfaces of the protrusions of the lower semiconductor chip in a vertical direction, the first upper semiconductor chip comprising a second semiconductor substrate comprising a second semiconductor device thereon and a plurality of second through-electrodes configured to penetrate the second semiconductor substrate, and a third semiconductor substrate stacked on the first upper semiconductor chip and electrically connected to the plurality of second through-electrodes, the third semiconductor substrate comprising a third semiconductor device thereon, wherein the second semiconductor device and the third semiconductor device are of an identical type and are different from the first semiconductor device.

19. The semiconductor package of claim 18, wherein the lower semiconductor chip further comprises a first cover insulating layer configured to cover a top surface of the protrusion, and the first upper semiconductor chip further comprises a second cover insulating layer configured to cover an active surface of the second semiconductor substrate, wherein a plurality of bonded pads are across the first cover insulating layer and the second cover insulating layer, and electrically connect a space between the first upper semiconductor chip and the plurality of first through-electrodes.

20. The semiconductor package of claim 19, further comprising a molding member configured to cover an upper surface of the lower semiconductor chip, the side surface of the first upper semiconductor chip, and the side surface of the protrusion, wherein a bottom surface of the molding member and bottom surfaces of the plurality of bonded pads are at an identical level.

* * * * *